(12) United States Patent
Ito

(10) Patent No.: US 7,891,366 B2
(45) Date of Patent: Feb. 22, 2011

(54) LIQUID PROCESSING APPARATUS

(75) Inventor: Norihiro Ito, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 809 days.

(21) Appl. No.: 11/808,852

(22) Filed: Jun. 13, 2007

(65) Prior Publication Data
US 2007/0289527 A1 Dec. 20, 2007

(30) Foreign Application Priority Data

| Jun. 16, 2006 | (JP) | ............................... 2006-167971 |
| Jul. 28, 2006 | (JP) | ............................... 2006-207044 |
| Jul. 28, 2006 | (JP) | ............................... 2006-207045 |

(51) Int. Cl.
*B08B 3/00* (2006.01)

(52) U.S. Cl. .................. 134/137; 134/201; 134/902; 118/52; 427/240

(58) Field of Classification Search .................. None
See application file for complete search history.

(56) References Cited

U.S. PATENT DOCUMENTS

| 5,688,322 A | 11/1997 | Motoda et al. |
| 5,718,763 A | 2/1998 | Tateyama et al. |
| 6,447,608 B1 | 9/2002 | Sakai et al. |
| 2004/0180141 A1* | 9/2004 | Kobayashi et al. ........... 427/240 |
| 2004/0180142 A1 | 9/2004 | Kobayashi et al. |

FOREIGN PATENT DOCUMENTS

| JP | 08-001064 | 1/1996 |
| JP | 2002-368066 | 12/2002 |

* cited by examiner

*Primary Examiner*—Michael Barr
*Assistant Examiner*—Jason Y Ko
(74) *Attorney, Agent, or Firm*—Smith, Gambrell & Russell, LLP

(57) ABSTRACT

A liquid processing apparatus includes a substrate holding member configured to rotate along with a substrate held thereon in a horizontal state; a rotary cup configured to surround the substrate held on the substrate holding member, to rotate along with the substrate, and to receive the process liquid thrown off from the substrate; a rotation mechanism configured to integrally rotate the rotary cup and the substrate holding member; and a liquid supply mechanism configured to supply a process liquid onto the substrate. The apparatus further includes an annular drain cup and an annular exhaust cup with an exhaust port connected thereto to discharge a collected gas component. A gas-flow adjusting mechanism is disposed between the exhaust cup and the exhaust port and configured to adjust a gas flow of the gas component to flow toward the exhaust port from essentially all around within the exhaust cup.

27 Claims, 15 Drawing Sheets

LIQUID PROCESSING APPARATUS

BACKGROUND OF THE INVENTION

1. Field of the Invention

The present invention relates to a liquid processing apparatus for performing a predetermined liquid process on a substrate, such as a semiconductor wafer.

2. Description of the Related Art

In the process of manufacturing semiconductor devices or flat panel display devices (FPD), liquid processes are frequently used, in which a process liquid is supplied onto a target substrate, such as a semiconductor wafer or glass substrate. For example, processes of this kind encompass a cleaning process for removing particles and/or contaminants deposited on a substrate, and a coating process for applying a photo-resist liquid or development liquid in a photolithography stage.

In general, an apparatus of this kind is arranged to supply a process liquid onto the center of a wafer, and rotate the wafer to spread the process liquid outward, thereby forming a liquid film and throwing off the process liquid. A surrounding member, such as a cup, is disposed around the wafer to guide downward the process liquid thrown off from the wafer, so that the process liquid is swiftly drained. However, where such a cup or the like is used, part of the process liquid may bounce back to the wafer as mist, and generate defects thereon, such as water marks and/or particles.

As a technique for preventing this problem, Jpn. Pat. Appln. KOKAI Publication No. 8-1064 (Patent Document 1) discloses a technique which utilizes a process liquid receiving member to be rotated integrally with rotary support means that rotates along with a substrate held thereon in a horizontal state. The process liquid receiving member receives a process liquid scattered around the substrate, and guides the process liquid outward to collect it. According to Patent Document 1, the process liquid receiving member includes a horizontal eaves portion, an inclined guide portion for guiding the process liquid outward and downward, a horizontal guide portion for guiding the process liquid outward in the horizontal direction, and a wall portion extending upward in the vertical direction, in this order from the substrate side. With this arrangement, the process liquid is guided into a narrow space to prevent mist from bouncing back onto the substrate, while the process liquid is drained from a drain port formed at a corner of the process receiving member. The process liquid is then discharged through grooves extending outward within a spacer disposed around the process liquid receiving member.

However, in the case of the technique disclosed in Patent Document 1, the process liquid is guided into a narrow space around the substrate by the process liquid receiving member that rotates along with the substrate. Accordingly, the spacer portion around the substrate needs to be larger and increases the foot print of the apparatus. Further, since exhaust gas is discharged along with drainage, it is necessary to dispose a mechanism for separating the exhaust gas and drainage on the downstream side. In order to separate exhaust gas and drainage without using a mechanism for separating them, it may be possible to separately dispose an exhaust cup and a drain cup. However, if the exhaust cup and drain cup are simply separately disposed, the foot print of the apparatus is further increased.

Where gasified components of a process liquid is exhausted from around a process liquid receiving member, it is necessary to receive the gasified components by an annular exhaust cup and discharge the gasified components smoothly and uniformly from all around through an exhaust port or exhaust ports formed at one or several positions. However, Patent Document 1 is silent about techniques for performing such exhaust.

On the other hand, in general, a drain cup for receiving drainage is annular, made of a synthetic resin, and fixed by appropriate means. The annular drain cup receives, from a rotating process liquid receiving member, a process liquid, which may have a relatively high temperature of, e.g., 80° C. When the drain cup, made of a synthetic resin, receives such a process liquid, the drain cup is thermally expanded to a large extent. Consequently, depending on the mounting manner of the drain cup, the thermal expansion may be insufficiently absorbed, thereby damaging the drain cup.

In the case of a liquid processing apparatus of the type that rotate a substrate held in a horizontal state, if the position of the substrate is shifted during rotation, problems, such as substrate damage, may be caused. Accordingly, there is known a substrate holding member provided with holding accessories (chuck) for holding the outer edge of the substrate, so that the substrate is reliably fixed to and integrally rotated with the substrate holding member (for example, Jpn. Pat. Appln. KOKAI Publication No. 2002-368066 (Patent Document 2: FIG. 15 and so forth)).

In the liquid processing apparatus disclosed in Patent Document 2, the holding accessories are disposed at several positions to extend below the substrate holding member on the lower side, and respectively include portions for holding the outer edge of a substrate on the upper side. When the substrate holding member provided with these holding accessories is rotated, portions of the holding accessories extending downward from the substrate holding member generate stray winds below the substrate holding member. The stray winds may affect an exhaust gas flow below the substrate holding member and hinder mist from being discharged, thereby causing mist to bounce back to the front surface of the substrate, and generate defects thereon, such as water marks and/or particles. Further, stray winds generated below the substrate holding member may affect a drainage flow of a process liquid in a drain cup and hinder the process liquid from efficiently flowing into a drain port.

BRIEF SUMMARY OF THE INVENTION

An object of the present invention is to provide a liquid processing apparatus that requires no special mechanism for separating exhaust gas and drainage, and allows exhaust gas to be uniformly discharged all over an exhaust cup.

Another object of the present invention is to provide a liquid processing apparatus that requires no special mechanism for separating exhaust gas and drainage, and prevents damage due to thermal expansion when a process liquid is used at a high temperature.

Another object of the present invention is to provide a liquid processing apparatus that prevents flows of exhaust gas and/or drainage from suffering ill effects of stray winds generated below a substrate holding member for rotating a substrate held thereon in a horizontal state.

According to a first aspect of the present invention, there is provided a liquid processing apparatus comprising: a substrate holding member configured to rotate along with a substrate held thereon in a horizontal state; a rotary cup configured to surround the substrate held on the substrate holding member, to rotate along with the substrate, and to receive the process liquid thrown off from the substrate; a rotation mechanism configured to integrally rotate the rotary cup and the substrate holding member; a liquid supply mechanism configured to supply a process liquid onto the substrate; an annular drain cup surrounding the rotary cup and configured to receive and discharge the process liquid discharged from the rotary cup; an annular exhaust cup accommodating the drain cup coaxially therewith and configured to mainly collect a gas component from inside and around the rotary cup; an exhaust port connected to the exhaust cup to discharge the gas component collected in the exhaust cup; and a gas-flow adjusting mechanism disposed between the exhaust cup and the exhaust port and configured to adjust a gas flow of the gas component to flow toward the exhaust port from essentially all around within the exhaust cup.

In the first aspect described above, the gas-flow adjusting mechanism may comprise an annular buffer space formed coaxially with the drain cup inside the exhaust cup and connected to the exhaust port. The exhaust port may be located at least one position directly below the buffer space. The buffer space may be defined by a bottom portion of the drain cup recessed from below.

The gas-flow adjusting mechanism may comprise an annular outer gas-flow resistance portion disposed between the drain cup and the exhaust cup and connecting an upper exhaust inlet port of the exhaust cup located above the substrate holding member to the buffer space essentially all over an annular direction, and the outer gas-flow resistance portion may be configured to apply a predetermined gas-flow resistance to an exhaust gas flow from the upper exhaust inlet port. In this case, an annular member may be disposed between the drain cup and the exhaust cup at a position corresponding to the outer gas-flow resistance portion, and the outer gas-flow resistance portion may comprise a plurality of gas-flow holes formed in the annular member uniformly all over an annular direction. An outer annular space may be formed between an outer wall of the drain cup and an outer wall of the exhaust cup and connect the upper exhaust inlet port to the outer gas-flow resistance portion.

The gas-flow adjusting mechanism may comprise an annular inner gas-flow resistance portion disposed between the drain cup and the exhaust cup and connecting a lower exhaust inlet port of the exhaust cup located below the substrate holding member to the buffer space essentially all over an annular direction, and the inner gas-flow resistance portion may be configured to apply a predetermined gas-flow resistance to an exhaust gas flow from the lower exhaust inlet port. In this case, a plurality of spacers may be disposed between the drain cup and the exhaust cup at a position corresponding to the inner gas-flow resistance portion, and the inner gas-flow resistance portion may comprise a plurality of openings formed between the spacers uniformly all over an annular direction. An inner annular space may be formed between an inner wall of the drain cup and an inner wall of the exhaust cup and connect the lower exhaust inlet port to the inner gas-flow resistance portion.

In the first aspect described above, the drain cup may have an inner peripheral side fixed to the exhaust cup by a fixing section and an outer peripheral side set in a non-fixed state in a radial direction. In this case, the fixing section may connect a bottom of the drain cup to a bottom of the exhaust cup. The drain cup may include a liquid receptacle for receiving the process liquid, and the fixing section may be annular and located on an inward side from the liquid receptacle. The drain cup may have an annular bore portion at a bottom outside the fixing section to define a flexible cylindrical portion extending from an upper portion of the drain cup to the fixing section. The fixing section may comprise a plurality of screwed portions and a plurality of positioning portions arrayed in an annular direction. The outer peripheral side of the drain cup may have a bottom slidably supported on bottom of the exhaust cup.

In the first aspect described above, it may be arranged such that the substrate holding member is provided with an accessory protruding below a lower surface thereof, the drain cup includes a liquid receptacle for receiving the process liquid, and a shielding wall is disposed between the accessory and the liquid receptacle to shield a stray wind generated by the accessory. In this case, the accessory may be configured to hold the substrate on an upper end. The shielding wall may be cylindrical to surround the accessory below the substrate holding member. The shielding wall may be formed on the drain cup. The drain cup may be partitioned by the shielding wall into the liquid receptacle and a liquid receiving portion on an inward side, and the liquid receiving portion may be configured to receive the process liquid flowing onto a lower surface of the substrate holding member and connected to the liquid receptacle through a hole formed in the shielding wall.

The shielding wall may be formed on the lower surface of the substrate holding member and extends downward. A partition wall may be disposed between a rotary shaft of the rotation mechanism and the shielding wall to separate an atmosphere around the rotary shaft from an atmosphere around the drain cup below the substrate holding member. The apparatus may further comprise a pressure adjusting mechanism configured to adjust pressure in a space partitioned by the partition wall around the rotary shaft. The apparatus may further comprise a gas supply portion configured to supply a purge gas into a space partitioned by the partition wall around the rotary shaft. A second shielding wall may be disposed directly below the accessory between the partition wall and the shielding wall to shield the stray wind. The substrate holding member may have a lower surface provided with a plurality of arc-like protrusions to suppress generation of a stray wind by the accessory, and the accessory may be located between the protrusions.

According to a second aspect of the present invention, there is provided a liquid processing apparatus comprising: a substrate holding member configured to rotate along with a substrate held thereon in a horizontal state; a rotary cup configured to surround the substrate held on the substrate holding member, to rotate along with the substrate, and to receive the process liquid thrown off from the substrate; a rotation mechanism configured to integrally rotate the rotary cup and the substrate holding member; a liquid supply mechanism configured to supply a process liquid onto the substrate; an annular drain cup surrounding the rotary cup and configured to receive and discharge the process liquid discharged from the rotary cup; and an annular exhaust cup accommodating the drain cup coaxially therewith and configured to mainly collect and discharge a gas component from inside and around the rotary cup, wherein the drain cup has an inner peripheral side fixed to the exhaust cup by a fixing section and an outer peripheral side set in a non-fixed state in a radial direction.

According to a third aspect of the present invention, there is provided a liquid processing apparatus comprising: a substrate holding member configured to rotate along with a substrate held thereon in a horizontal state; a rotation mechanism configured to rotate the substrate holding member; a liquid supply mechanism configured to supply a process liquid onto the substrate; and an annular drain cup surrounding the substrate holding member and configured to receive and discharge the process liquid discharged therein, wherein the substrate holding member is provided with an accessory protruding below a lower surface thereof, the drain cup includes a liquid receptacle for receiving the process liquid, and a shielding wall is disposed between the accessory and the liquid receptacle to shield a stray wind generated by the accessory.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
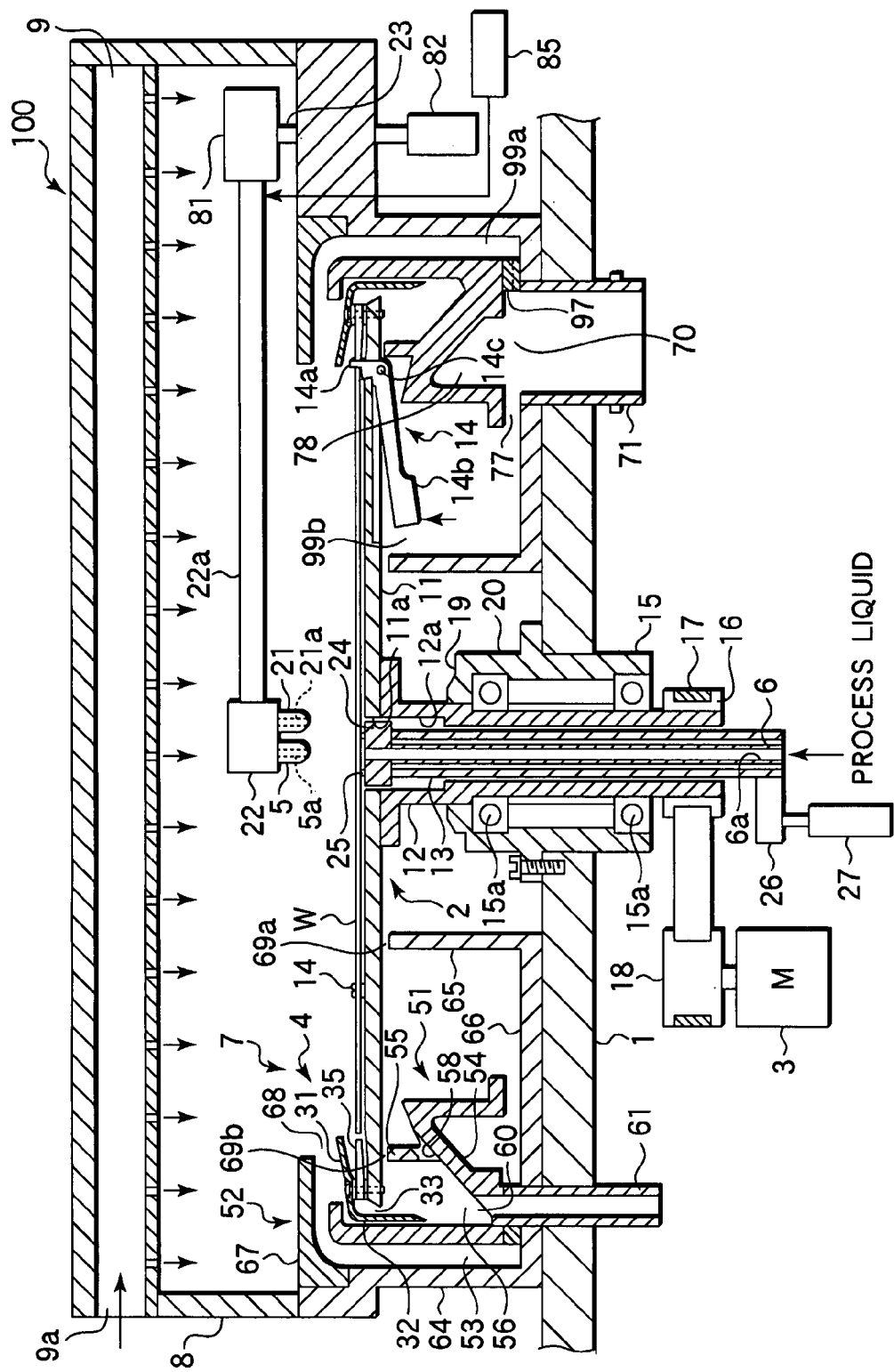
FIG. 1 is a sectional view schematically showing the structure of a liquid processing apparatus according to a first embodiment of the present invention.

Embodiments of the present invention will now be described with reference to the accompanying drawings. In the following description, the constituent elements having substantially the same function and arrangement are denoted by the same reference numerals, and a repetitive description will be made only when necessary. Hereinafter, an explanation will be given of a case where the present invention is applied to a liquid processing apparatus that can perform a cleaning process on the front and back surfaces of a semiconductor wafer (which will be simply referred to as "wafer", hereinafter).

Figure 2:
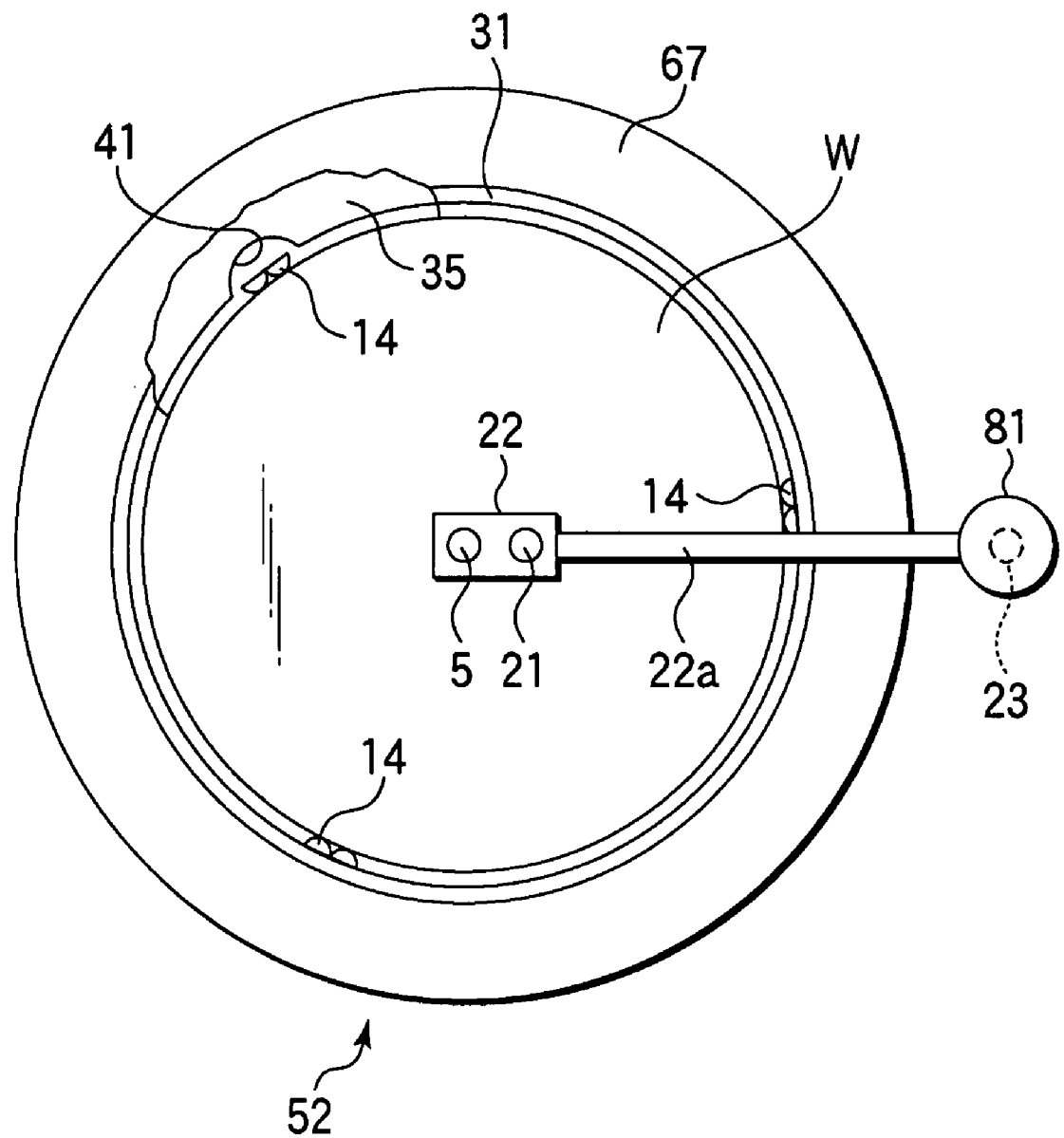
FIG. 2 is a partially sectional plan view schematically showing the liquid processing apparatus according to the first embodiment of the present invention.
Figure 3:
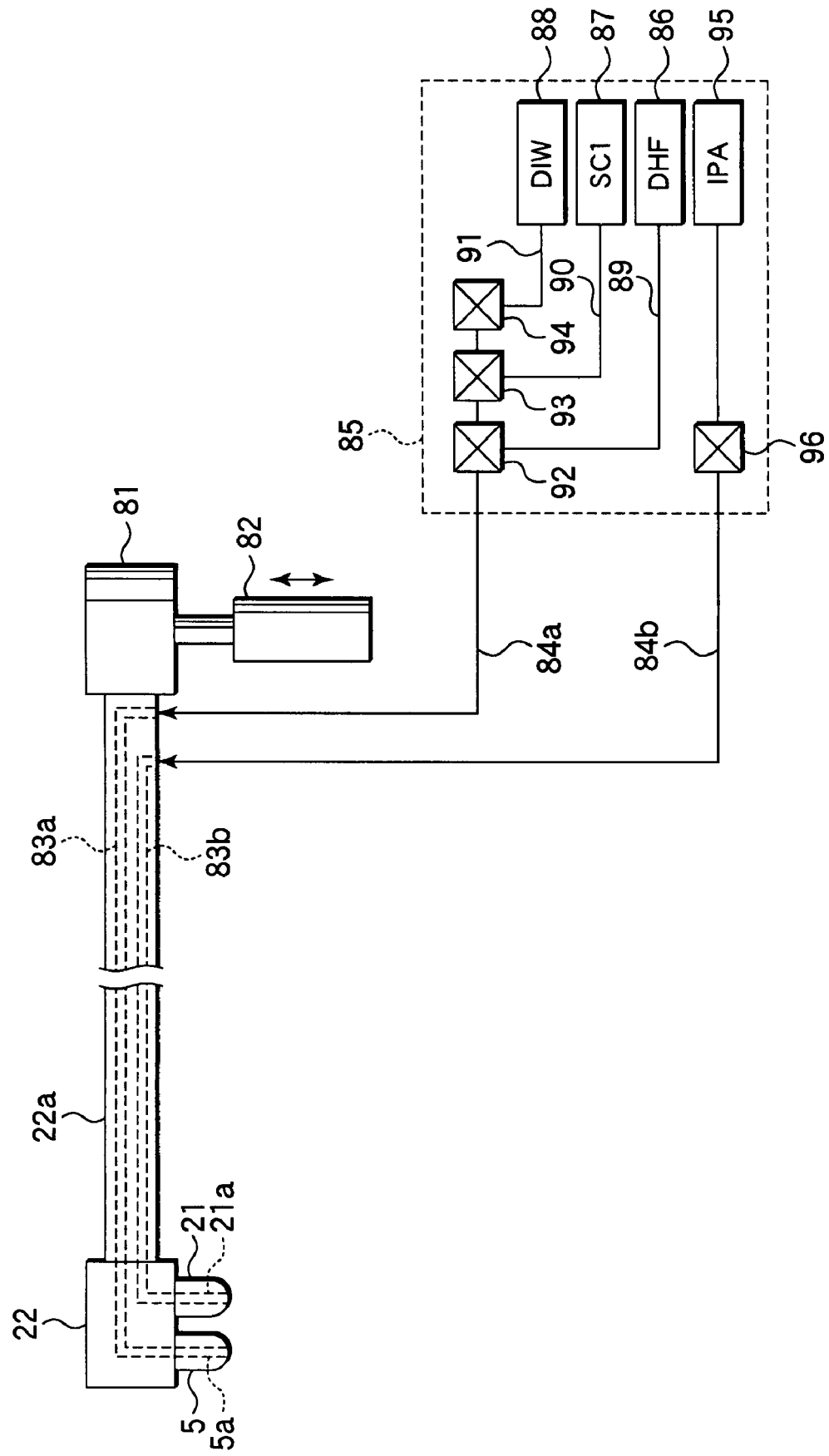
FIG. 3 is a view schematically showing a process liquid supply mechanism used in the liquid processing apparatus shown in FIG. 1.
Figure 4:
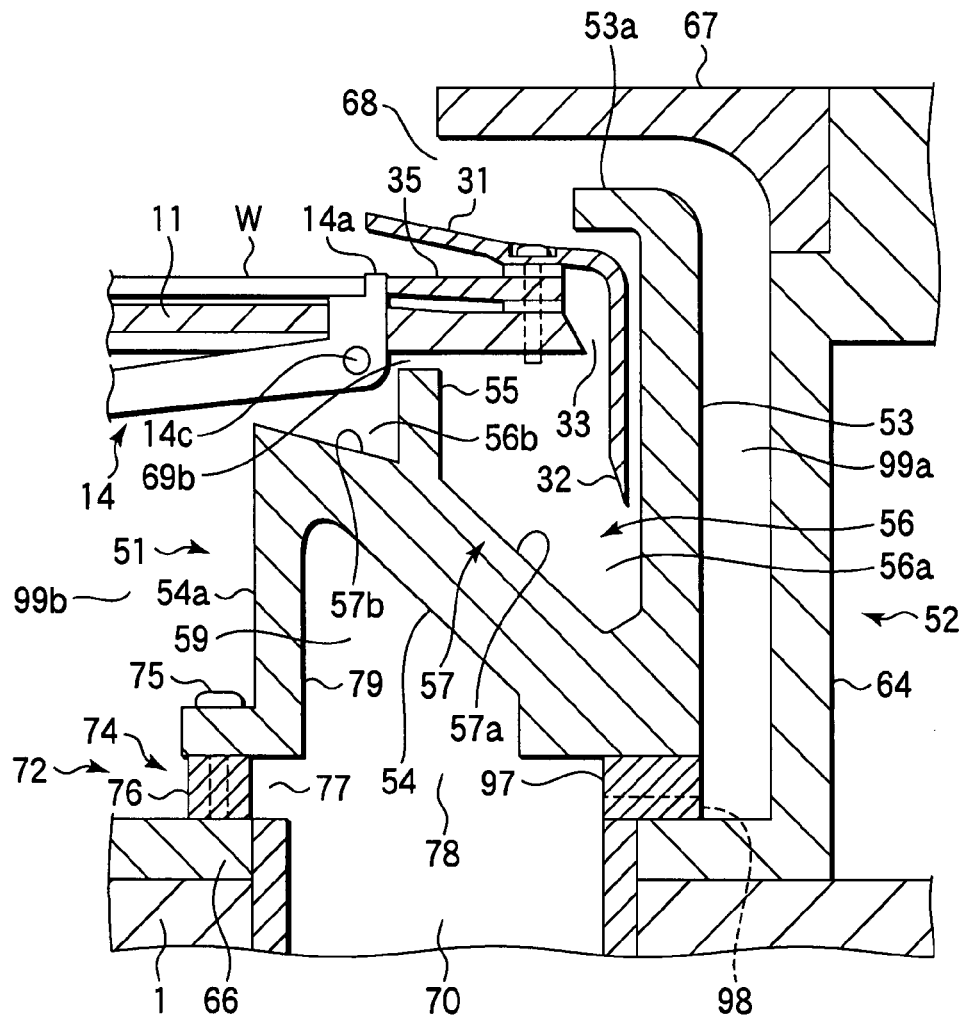
FIG. 4 is an enlarged sectional view showing an exhaust/drain section used in the liquid processing apparatus shown in FIG. 1.

FIG. 1 is a sectional view schematically showing the structure of a liquid processing apparatus according to a first embodiment of the present invention, and FIG. 2 is a plan view thereof. FIG. 3 is a view schematically showing a process liquid supply mechanism used in the liquid processing apparatus shown in FIG. 1. FIG. 4 is an enlarged sectional view showing an exhaust/drain section used in the liquid processing apparatus shown in FIG. 1. A liquid processing system (not shown) contains a plurality of apparatuses disposed therein, each of which is the same as this liquid processing apparatus 100. This liquid processing apparatus 100 includes a base plate 1 and a wafer holding member 2 for rotatably holding a target substrate or wafer W. The wafer holding member 2 is rotatable by a rotary motor 3. A rotary cup 4 is disposed around the wafer W held on the wafer holding member 2 and configured to rotate along with the wafer holding member 2. The liquid processing apparatus 100 further includes a front surface process liquid supply nozzle 5 for supplying a process liquid onto the front surface of the wafer W, and a back surface process liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a gas flow inlet section 9 at the top arranged to receive through an inlet port 9a formed on a lateral side a gas flow supplied from a fan/filter unit (FFU) 9 of the liquid processing system, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. An elevating member 13 supporting the back surface process liquid supply nozzle 6 is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end. The shaft of the motor 3 is also provided with a pulley 18 fitted thereon. A belt 17 is wound around between these pulleys 16 and 18. The rotary shaft 12 is rotated through the pulley 18, belt 17, and pulley 16 by rotation of the motor 3.

The front surface process liquid supply nozzle 5 is attached to a nozzle holding member 22 supported on the distal end of a nozzle arm 22a. A process liquid or the like is supplied from a process liquid supply mechanism 85 described later through a flow passage formed in the nozzle arm 22a, and is then delivered from a nozzle hole 5a formed in the nozzle 5. For example, the process liquid thus delivered encompasses a chemical solution for wafer cleaning, a rising liquid such as purified water, and so forth. The nozzle holding member 22 is further provided with a drying solvent nozzle 21 attached thereon for delivering a drying solvent, such as IPA. A drying solvent, such as IPA, is delivered from a nozzle hole 21a formed in the nozzle 21.

As shown in FIG. 2, the nozzle arm 22a is rotatable by a driving mechanism 81 about a shaft 23 used as a central axis to move the front surface process liquid supply nozzle 5 between wafer cleaning positions above the center and periphery of the wafer W and a retreat position outside the wafer W. Further, the nozzle arm 22a is movable up and down by an elevating mechanism 82, such as a cylinder mechanism.

As shown in FIG. 3, the nozzle arm 22a has a flow passage 83a formed therein and connected at one end to the nozzle hole 5a of the front surface process liquid supply nozzle 5. The other end of the flow passage 83a is connected to a tube 84a. The nozzle arm 22a further has a flow passage 83b formed therein and connected at one end to the nozzle hole 21a of the drying solvent nozzle 21. The other end of the flow passage 83b is connected to a tube 84b. Predetermined process liquids are supplied through the tubes 84a and 84b from the process liquid supply mechanism 85. The process liquid supply mechanism 85 includes cleaning chemical solution sources, such as a DHF supply source 86 for supplying dilute hydrofluoric acid (DHF) as an acidic chemical solution and an SC1 supply source 87 for supplying ammonia hydrogen peroxide solution (SC1) as an alkaline chemical solution. The process liquid supply mechanism 85 further includes a rinsing liquid source, such as a DIW supply source 88 for supplying purified water (DIW) and a drying solvent source, such as an IPA supply source 95 for supplying IPA. The DHF supply source 86, SC1 supply source 87, and DIW supply source 88 are connected to tubes 89, 90, and 91 extending therefrom. The tubes 89, 90, and 91 are connected to the tube 84a through switching valves 92, 93, and 94. Accordingly, ammonia hydrogen peroxide solution (SC1), dilute hydrofluoric acid (DHF), and purified water (DIW) are selectively supplied to the front surface process liquid supply nozzle 5 by operating the switching valves 92, 93, and 94. In this case, the tube 91 extending from the DIW supply source 88 is connected to the most upstream side of the tube 84a. On the other hand, the IPA supply source 95 is directly connected to the tube 84b extending from the flow passage 83b and provided with a switching valve 96 thereon. Accordingly, IPA is supplied to the drying solvent nozzle 21 by opening the switching valve 96.

The back surface process liquid supply nozzle 6 has a nozzle hole 6a formed through the center of the elevating member 13 and extending in the longitudinal direction. A predetermined process liquid is supplied from a process liquid supply mechanism (not shown) into the nozzle hole 6a from below and is then delivered from the nozzle hole 6a onto the back surface of the wafer W. For example, the process liquid thus delivered encompasses a cleaning chemical solution, a rising liquid such as purified water, and so forth, as in the front surface process liquid supply nozzle 5. The process liquid supply mechanism for supplying a process liquid into the back surface process liquid supply nozzle 6 may be structured as in the process liquid supply mechanism 85 except for the IPA supply circuit. The elevating member 13 includes a wafer support head 24 at the top for supporting the wafer W. The wafer support head 24 is provided with three wafer support pins 25 for supporting the wafer W (only two of them are shown) on the upper surface. The lower end of the back surface process liquid supply nozzle 6 is connected to a cylinder mechanism 27 through a connector 26. The elevating member 13 is movable up and down by the cylinder mechanism 27 to move up and down the wafer W for loading and unloading the wafer W.

The rotary cup 4 includes an annular eaves portion 31 inclined to extend inward and upward from a position above the end of the rotary plate 11 and a cylindrical outer wall portion 32 extending vertically downward from the outer end of the eaves portion 31. As shown in the enlarged view of FIG. 4, an annular gap 33 is formed between the outer wall portion 32 and rotary plate 11, so that a process liquid (mist) scattered by rotation of the wafer W along with the rotary plate 11 and rotary cup 4 is guided downward through the gap 33.

Figure 5:
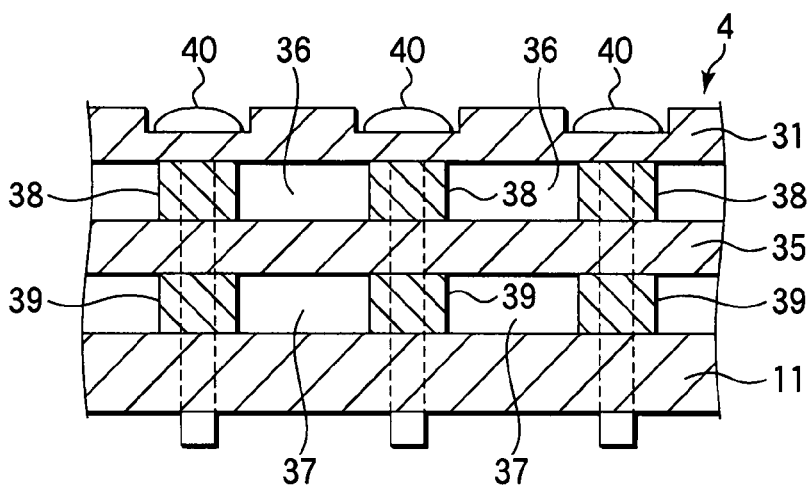
FIG. 5 is a view for explaining the arrangement of a rotary cup and a guide member used in the liquid processing apparatus shown in FIG. 1.

A plate-like guide member 35 is disposed between the eaves portion 31 and rotary plate 11 at a height essentially the same as the wafer W. As shown in FIG. 5, a plurality of spacers 38 and 39 are disposed in an annular direction between the eaves portion 31 and guide member 35 and between the guide member 35 and rotary plate 11 to form openings 36 and 37 for allowing the process liquid to pass therethrough. The eaves portion 31, guide member 35, rotary plate 11, and spacers 38 and 39 are fixed to each other by screws 40.

The guide member 35 is arranged such that the upper and lower surfaces thereof are to be almost continued to the front and back surfaces of the wafer W. When a process liquid is supplied onto the center of the front surface of the wafer W from the front surface process liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the guide member 35 almost continued thereto. Then, the process liquid is discharged outward through the openings 36, and is guided downward by the outer wall portion 32. Similarly, when a process liquid is supplied onto the center of the back surface of the wafer W from the back surface process liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W.

The process liquid thus thrown off from the back surface of the wafer W is guided by the lower surface of the guide member 35 almost continued thereto. Then, the process liquid is discharged outward through the openings 37, and is guided downward by the outer wall portion 32. At this time, since a centrifugal force acts on the process liquid guided to the spacers 38 and 39 and outer wall portion 32, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup 4 while preventing the process liquid from being turned into mist. As shown in FIG. 2, the guide member 35 has notches 41 at positions corresponding to the wafer holding accessories 14 to accept the wafer holding accessories 14.

The rotary plate 11, rotary cup 4, spacers 38 and 39, screws 40, guide member 35, and so forth are made of a synthetic resin, such as PEEK, PTFE, PVC, PFA, or PVDF, in light of a chemical resistance or the like.

The exhaust/drain section 7 is mainly used for collecting exhaust gas and drainage discharged from the space surrounded by the rotary plate 11 and rotary cup 4. As shown in the enlarged view of FIG. 4, the exhaust/drain section 7 includes an annular drain cup 51 disposed to receive the process liquid discharged from the rotary cup 4, and an annular exhaust cup 52 accommodating the drain cup 51 and disposed coaxially with the drain cup 51. The drain cup 51 and annular exhaust cup 52 are made of a synthetic resin, such as PEEK, PTFE, PVC, PFA, or PVDF, in light of a chemical resistance or the like, as in the rotary cup 4.

As shown in FIGS. 1 and 4, the drain cup 51 includes a cylindrical vertical wall 53 disposed outside the rotary cup 4 adjacent to the outer wall portion 32, and a lower side portion 54 extending inward from the lower end of the vertical wall 53. The lower side portion 54 is connected to a vertical inner wall 54a on the inner side. The vertical wall 53 and lower side portion 54 define an annular space used as a process liquid receptacle 56 for receiving the process liquid discharged from the rotary cup 4. The upper side of the vertical wall 53 is formed as an extending portion 53a extending to a position above the rotary cup 4 to prevent the process liquid from bouncing out from the drain cup 51. The process liquid receptacle 56 includes an annular partition wall 55 disposed therein in an annular direction of the drain cup 51 outside the holding accessory 14 and extending from the lower side portion 54 to a position near the lower surface of the rotary plate 11. The process liquid receptacle 56 is divided by the partition wall 55 into a main cup portion 56a and an auxiliary cup portion 56b. The main cup portion 56a is used for receiving the process liquid discharged from the gap 33, while the auxiliary cup portion 56b is used for receiving the process liquid dropping from portions near the holding portions 14a of the holding accessories 14. The bottom surface 57 of the process liquid receptacle 56 is divided by the partition wall 55 into a first portion 57a corresponding to the main cup portion 56a and a second portion 57b corresponding to the auxiliary cup portion 56b. The first and second portions 57a and 57b are inclined upward and inward (toward the rotational center). The inner side of the second portion 57b extends inward (toward the rotational center) further from a position corresponding to the holding portions 14a of the holding accessories 14. The partition wall 55 serves to prevent stray winds, generated by the portions of the holding accessories 14 protruding downward below the rotary plate 11, from involving and transferring mist onto the wafer W. The partition wall 55 has a hole 58 formed therein to guide the process liquid from the auxiliary cup portion 56b to the main cup portion 56a (see FIG. 1).

Figure 6:
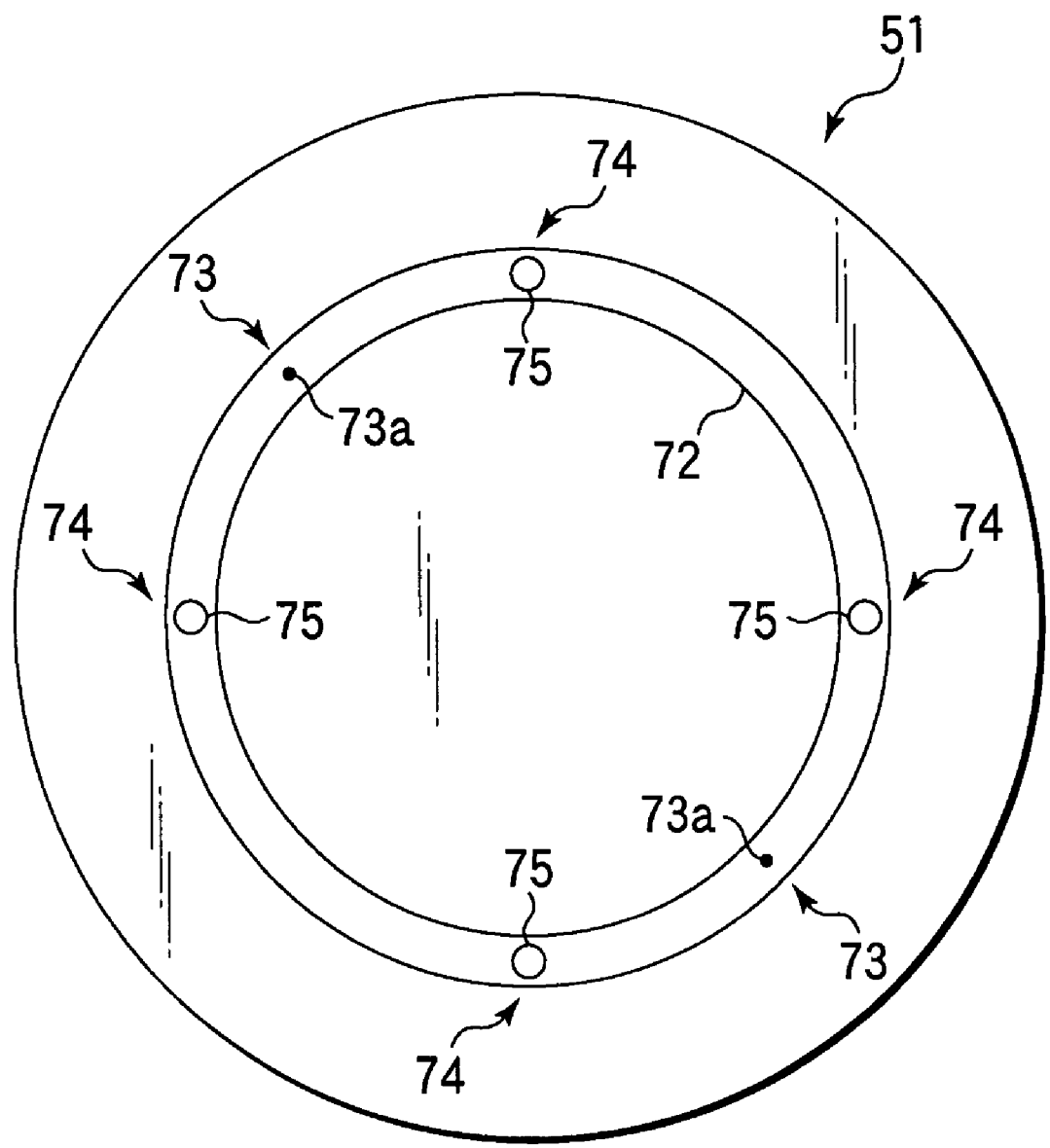
FIG. 6 is a plan view showing a fixing section for a drain cup used in the liquid processing apparatus shown in FIG. 1.

The drain cup 51 includes an annular (flange-like) fixing section 72 at the bottom on the inner peripheral side to fix the drain cup 51 to the bottom of the exhaust cup 52. As shown in FIG. 6, the fixing section 72 includes two positioning portions 73 and four screwed portions 74. The positioning portions 73 have synthetic resin positioning pins 73a inserted into recesses formed in the exhaust cup 52 to position the drain cup 51 relative to the exhaust cup 52. The screwed portions 74 are fixed to the exhaust cup 52 by synthetic resin screws 75. A plurality of spacers 76 are disposed between the positioning portions 73 and screwed portions 74, so that gaps 77 are formed between the fixing section 72 and exhaust cup 52 by the spacers 76 uniformly all over an annular direction. The numbers of positioning portions 73 and screwed portions 74 are not limited to the examples described above, although each of them needs to be two or more.

A portion of the drain cup 51 below the lower side portion 54 is removed or recessed from below to form a bore portion 59 below the lower side portion 54 and outside the fixing section 72. This bore portion 59 is formed to define a flexible thin cylindrical portion 79 extending upward from the fixing section 72. The cylindrical portion 79 has a thickness of about 3 to 6 mm. The bore portion 59 further defines an annular buffer space 78 located coaxially with the drain cup 51 within the exhaust cup 52 and connected to exhaust ports 70, as described later.

As described above, the drain cup 51, which is made of a synthetic resin and thus inherently has a large coefficient of thermal expansion, is arranged such that the inner peripheral side is fixed by the fixing section 72, while the outer peripheral side where large thermal expansion can be caused is not fixed. Consequently, when the drain cup 51 receives a high temperature process liquid discharged therein and thereby causes thermal expansion, it is unlikely that the drain cup 51 is damaged by the thermal expansion. The fixing section 72 is located on the inward side from the process liquid receptacle 56, so that the fixing section 72 is thus less thermally affected by the high temperature process liquid. Further, the flexible thin cylindrical portion 79 serves to suppress thermal effect on the fixing section 72 and also serves to flexibly absorb deformation of the drain cup 51 due to thermal expansion, when the high temperature process liquid is used. Consequently, the screws 75 and so forth used in the fixing section 72 of the drain cup 51 are prevented from being damaged by thermal expansion due to the process liquid.

The drain cup 51 has a drain port 60 for drainage from the process liquid receptacle 56, which is formed in the lower side portion 54 at one position on the outermost side and connected to a drain tube 61 (see FIG. 1). The drain tube 61 is connected to a drain-switching member (not shown), so that process liquids are separately collected or discarded in accordance with the types thereof. In place of a single drain port 60, a plurality of drain ports 60 may be formed.

The exhaust cup 52 includes an outer wall 64 vertically extending outside the vertical wall 53 of the drain cup 51, and an inner wall 65 disposed on the inward side from the holding accessories 14 and vertically extending to have an upper end adjacent to the rotary plate 11. The exhaust cup 52 further includes a bottom wall 66 placed on the base plate 1, and an upper wall 67 extending upward and curved from the outer wall 64 to cover an area above the rotary cup 4. The exhaust cup 52 is mainly used for collecting and exhausting gas components from inside and around the rotary cup 4, through an annular inlet port (upper exhaust inlet port) 68 formed between the upper wall 67 and eaves portion 31 of the rotary cup 4. As shown in FIGS. 1 and 4, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4. The plurality of exhaust ports 70 can be selectively used by switching in accordance with the types of process liquids. In place of the exhaust ports, a single exhaust port may be used and connected to an exhaust tube, which is branched on the downstream side into a plurality of exhaust lines switchable in accordance with the types of process liquids.

The annular buffer space 78 is defined above the exhaust ports 70 by the bore portion 59 of the drain cup 51, and is located coaxially with the drain cup 51 within the exhaust cup 52. In other words, at least one exhaust port 70 is formed directly below the buffer space 78 and is directly connected to the buffer space 78. Further, an outer annular space 99a is formed between the outer wall or vertical wall 53 of the drain cup 51 and the outer wall 64 of the exhaust cup 52. An annular gas flow adjusting member (gas-flow resistance portion) 97 is disposed between the bottom of the drain cup 51 and the bottom of the exhaust cup 52 outside the exhaust ports 70. The gas flow adjusting member 97 has a number of gas-flow holes 98 in an annular direction and is arranged to apply a predetermined gas-flow resistance to the exhaust gas flow from the inlet port (upper exhaust inlet port) 68 of the exhaust cup 52. The inlet port 68 is connected to the annular buffer space 78 through the outer annular space 99a and gas flow adjusting member 97 all over an annular direction.

This structure serves as a gas-flow adjusting mechanism for adjusting the gas flow of gas components collected in the exhaust cup 52 and uniformly discharging it from the exhaust ports 70. Specifically, this exhaust gas flow is guided downward through the annular space or outer annular space 99a uniformly all over an annular direction, and is then supplied with a pressure loss or resistance by the gas flow adjusting member 97 having a number of gas-flow holes 98, so that the gas flow is introduced into the buffer space 78 in a distributed state. Since the buffer space 78 provides a space having a sufficient capacity all over an annular direction above the exhaust ports 70 within the exhaust cup 52, the pressure loss applied to the gas flow is small (the resistance against the gas flow is small) even at positions remote from the exhaust ports 70 (positions across the exhaust ports 70). Consequently, the gas flow within the exhaust cup 52 is prevented from being localized, so that the gas flow is relatively uniformly discharged to the exhaust ports 70 from all around, regardless of the distance from the exhaust ports 70. In reverse, in the case of no restriction being prepared for the gas flow toward the exhaust ports 70, the gas flow is preferentially discharged only from around the exhaust ports 70, while it is hardly discharged from positions remote from the exhaust ports 70.

Gas components collected through the inlet port (upper exhaust inlet port) 68 slightly flow into the process liquid receptacle 56 of the drain cup 51, as well as the outer annular space 99a. In light of this, the exhaust cup 52 is arranged to further collect and discharge gas components below the wafer holding member 2. Specifically, an inner annular space 99b is formed between the inner wall 54a of the drain cup 51 and the inner wall 65 of the exhaust cup 52. An annular gap 69a formed between the upper end of the inner wall 65 and the lower surface of the rotary plate 11 and an annular gap 69b formed between the upper end of the partition wall 55 of the drain cup 51 and the lower surface of the rotary plate 11 serve as lower exhaust inlet ports for collecting gas components into the inner annular space 99b. Further, the gaps 77 are formed between the fixing section 72 and the exhaust cup 52 by the spacers 76 on the inner peripheral side of the drain cup 51 uniformly all over an annular direction to apply a predetermined gas-flow resistance to the exhaust gas flow.

This structure also serves as a gas-flow adjusting mechanism for adjusting the gas flow of gas components collected in the exhaust cup 52 and uniformly discharging it from the exhaust ports 70. Consequently, the exhaust gas flow from the process liquid receptacle 56 is guided through the inner annular space 99b and gaps 77, and is introduced into the annular buffer space 78 uniformly all over an annular direction, so that the gas flow is relatively uniformly discharged to the exhaust ports 70 from all around.

The portion between the gas flow adjusting member 97 and the bottom of the drain cup 51 on the outer peripheral side is not fixed but slidable. Specifically, the drain cup 51 is arranged such that the inner peripheral side is fixed to the exhaust cup 52 by the fixing section 72, while the bottom on the outer peripheral side is not fixed but slidable in the radial direction on the bottom of the exhaust cup 52. Consequently, as described previously, when the drain cup 51 receives a high temperature process liquid, it can be thermally expanded on the outer peripheral side without being restrained.

As described above, the process liquid is guided by the rotary cup 4 to the drain cup 51, and gas components are guided from the inlet port 68 to the exhaust cup 52. In this case, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust ports 70, so that the mist is reliably prevented from diffusing outside.

Figure 7A:
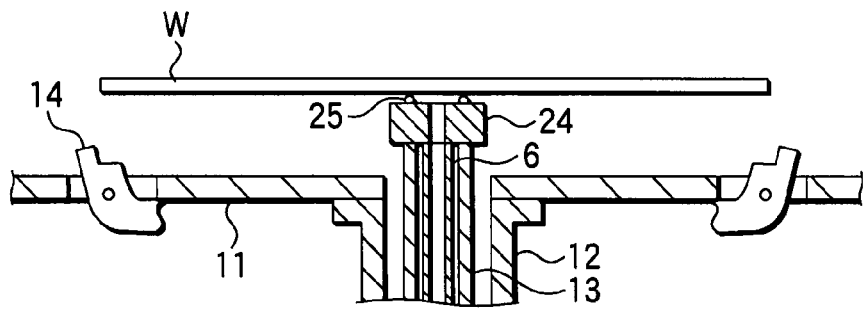
FIGS. 7A to 7D are views for explaining an operation of the liquid processing apparatus according to the first embodiment of the present invention.
Figure 7B:
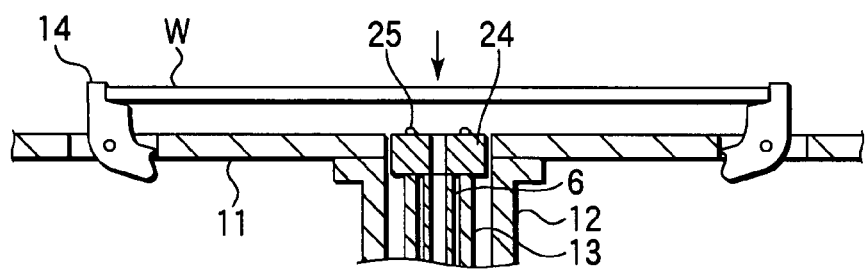
Figure 7C:
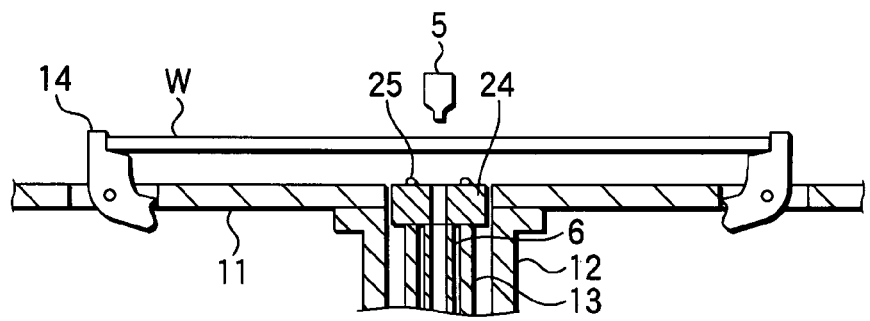

Next, an explanation will be given, with reference to FIGS. 7A to 7D, of an operation of the liquid processing apparatus 100 having the structure described above. At first, as shown in FIG. 7A, the elevating member 13 is set at the upper position, and a wafer W is transferred from a transfer arm (not shown) onto the support pins 25 of the wafer support head 24. Then, as shown in FIG. 7B, the elevating member 13 is moved down to a position where the wafer W can be held by the holding accessories 14, and then the wafer W is chucked by the holding accessories 14. Then, as shown in FIG. 7C, the front surface process liquid supply nozzle 5 is moved from the retreat position to the wafer cleaning position.

Figure 7D:
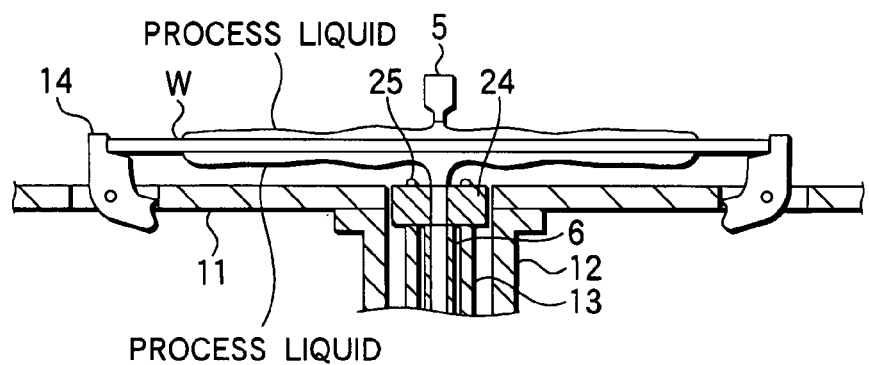

In this state, as shown in FIG. 7D, while the holding member 2 is rotated along with the rotary cup 4 and wafer W by the motor 3, a predetermined process liquid is supplied from the front surface process liquid supply nozzle 5 and back surface process liquid supply nozzle 6 to perform a cleaning process.

In this wafer cleaning process, the process liquid is supplied from the front surface process liquid supply nozzle 5 and back surface process liquid supply nozzle 6 onto the front surface and back surface of the wafer W, and is spread by a centrifugal force outward on the wafer W and thrown off from the peripheral edge of the wafer W.

The cup surrounding the wafer W used in this wafer cleaning process is the rotary cup 4 that is rotated along with the wafer W. Accordingly, when the process liquid thrown off from the wafer W hits against the rotary cup 4, a centrifugal force acts on the process liquid, and the process liquid is thereby inhibited from being scattered (turned into mist), unlike a case where a stationary cup is used for the same purpose. Then, the process liquid is guided downward by the rotary cup 4, and is discharged through the gap 33 into the main cup portion 56a of the drain cup 51. Further, since the rotary plate 11 has holes for inserting the holding portions 14a at positions where the holding accessories 14 are attached, the process liquid drops through the holes into the auxiliary cup portion 56b of the drain cup 51. The process liquid thus received by the drain cup 51 is discharged from the drain port 60 through the drain tube 61. Further, gas components are collected from inside and around the rotary cup 4 into the exhaust cup 52 through the annular inlet port 68 formed between the upper wall 67 and the eaves portion 31 of the rotary cup 4, and are discharged from the exhaust ports 70 through the exhaust tubes 71.

Due to the presence of the rotary cup 4, the drain cup 41 can be smaller as long as it is usable for draining. Further, the drain cup 51 and exhaust cup 52 are independent of each other such that exhaust gas and drainage are separately collected and separately discharged through the drain port 60 and exhaust ports 70. Accordingly, there is no need to dispose a special mechanism for separating drainage and exhaust gas. Further, the drain cup 51 is accommodated within the exhaust cup 52. Consequently, the structure for collecting exhaust gas and drainage can be arranged to have a smaller occupation space, so the apparatus can be compact with a small foot print. Furthermore, since the drain cup 51 is accommodated within the exhaust cup 52, it is possible to trap mist of the process liquid leaked out of the drain cup 51, thereby preventing the mist from exerting a bad influence while being scattered out of the apparatus.

Figure 8:
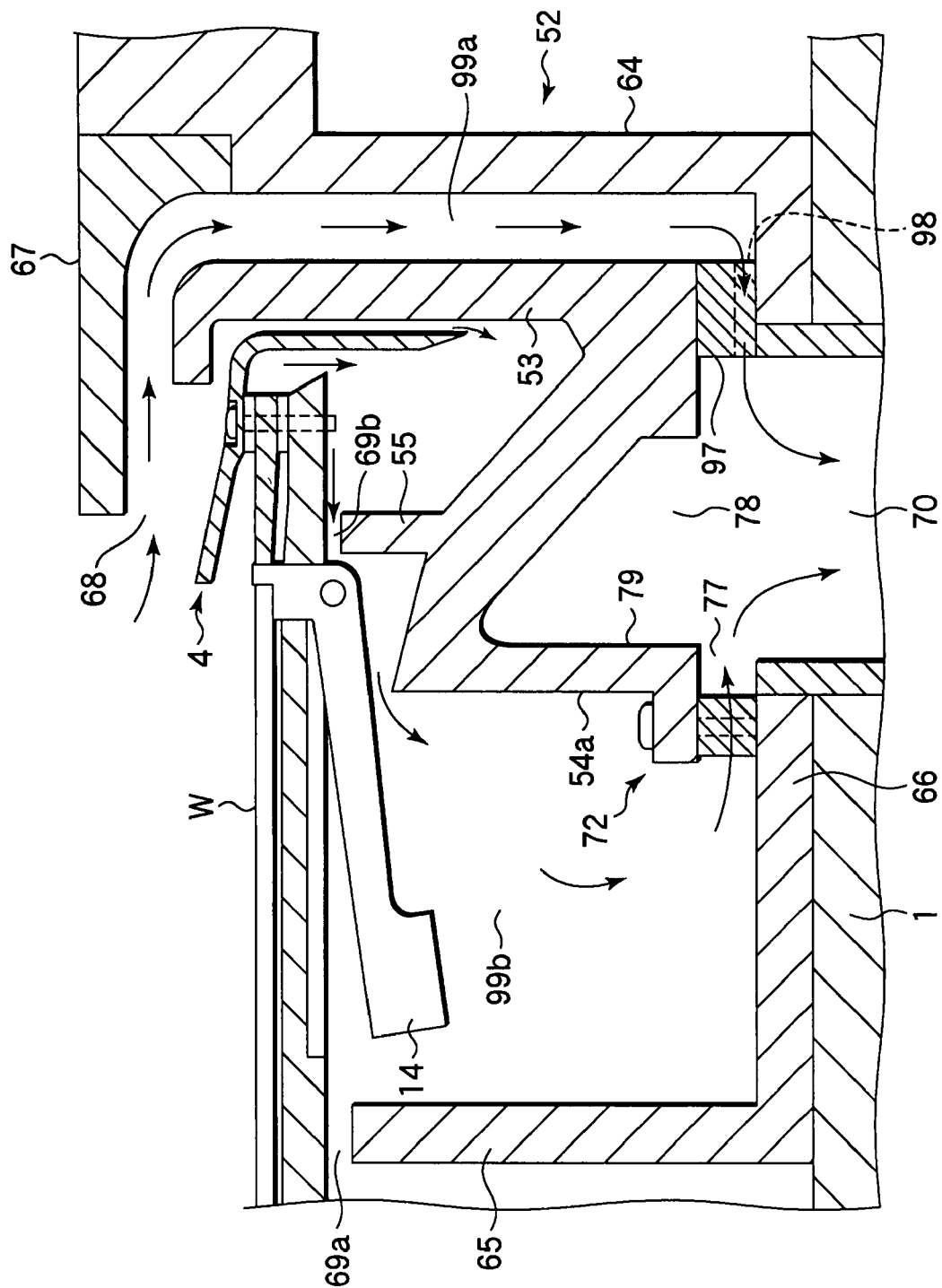
FIG. 8 is a view schematically showing exhaust routes within an exhaust cup used in the liquid processing apparatus shown in FIG. 1.

Incidentally, in the case of essentially no restriction being prepared for the flow of gas components collected in the exhaust cup 52 toward the exhaust ports 70, the gas flow is preferentially discharged only from around the exhaust ports 70, while it is hardly discharged from positions remote from the exhaust ports 70. In this respect, according to this embodiment, as shown in FIG. 8, the gas flow is guided downward through the outer annular space 99a uniformly all over an annular direction, and is then supplied with a pressure loss or resistance by the gas-flow holes 98 of the gas flow adjusting member 97, so that the gas flow is introduced into the buffer space 78 in a distributed state. Consequently, the gas flow within the exhaust cup 52 is prevented from being localized, so that the gas flow is relatively uniformly discharged to the exhaust ports 70 from all around, regardless of the distance from the exhaust ports 70.

As shown in FIG. 8, gas components collected through the inlet port 68 slightly flow into the process liquid receptacle 56 of the drain cup 51, as well as the outer annular space 99a, and then flow through the inner side of the drain cup 51 to the exhaust ports 70. In light of this, the inner annular space 99b is formed between the vertical inner wall 54a of the drain cup 51 on the inner side and the inner wall 65 of the exhaust cup 52. Further, the gaps 77 are formed between the fixing section 72 and the exhaust cup 52 on the inner peripheral side of the drain cup 51. In this case, the gas flow is guided downward through the process liquid receptacle 56 and inner annular space 99b uniformly all over an annular direction, and is then supplied with a resistance by the gaps 77, so that the gas flow is introduced into the buffer space 78 in a distributed state. Consequently, the gas flow within the exhaust cup 52 is prevented from being localized, so that the gas flow is relatively uniformly discharged to the exhaust ports 70 from all around, regardless of the distance from the exhaust ports 70. This gas flow through the inner annular space 99b to the exhaust ports 70 is smaller than the gas flow through the outer annular space 99a to the exhaust ports 70. Accordingly, the inner annular space 99b and gaps 77 suffice for making the gas flow uniform without using the gas flow adjusting member 97 as in the outer side.

A process liquid, such as SC1, may be used at a high temperature of, e.g., about 80° C. When the annular drain cup 51 made of a synthetic resin receives this process liquid, the drain cup 51 causes large thermal expansion due to the high temperature, and is particularly expanded on the outer peripheral side. If the drain cup 51 is structured to receive large thermal expansion by a fixing section, such as a case where the outer peripheral side of the drain cup is fixed, this fixing section may be damaged by the thermal expansion. In this respect, according to this embodiment, the fixing section 72 of the drain cup 51 is located only at the bottom on the inner peripheral side, while no fixing section is present on the outer peripheral side where large thermal expansion can be caused. The bottom on the outer peripheral side is not fixed but slidable in the radial direction on the gas flow adjusting member 97, so it is unlikely that the drain cup 51 is damaged by the thermal expansion. The fixing section 72 is located on the inward side from the process liquid receptacle 56, so that the fixing section 72 is thus less thermally affected by the high temperature process liquid. Further, the flexible thin cylindrical portion 79 serves to suppress heat transmission to the fixing section 72 and also serves to flexibly absorb deformation of the drain cup 51 due to thermal expansion, when the high temperature process liquid is used. Consequently, the screws 75 and so forth used in the fixing section 72 of the drain cup 51 are reliably prevented from being damaged by thermal expansion due to the process liquid.

In the first embodiment of the present invention described with reference to FIGS. 1 to 8, since the rotary cup is rotated along with the substrate, a centrifugal force acts on the rotary cup, so mist of the process liquid is inhibited from bouncing back, unlike a case where a stationary cup is used for the same purpose. Further, the annular drain cup is disposed around the rotary cup, and the exhaust cup is disposed to accommodate the drain cup coaxially therewith. In this case, the drain cup can be more compact because the rotary cup prevents mist from bouncing back while the drain cup is accommodated in the exhaust cup. Consequently, it is possible to make the occupation space of the drain cup smaller, thereby providing the apparatus with a small foot print. Further, since the liquid-draining from the drain cup is performed independently of the gas-exhausting from the exhaust cup, there is no need to dispose a special mechanism for separating drainage and exhaust gas.

The gas-flow adjusting mechanism is disposed to adjust a flow of gas components collected in the exhaust cup to be formed toward the exhaust ports from essentially all around. Consequently, the exhaust gas within the exhaust cup can be uniformly discharged all over an annular direction.

Figure 9:
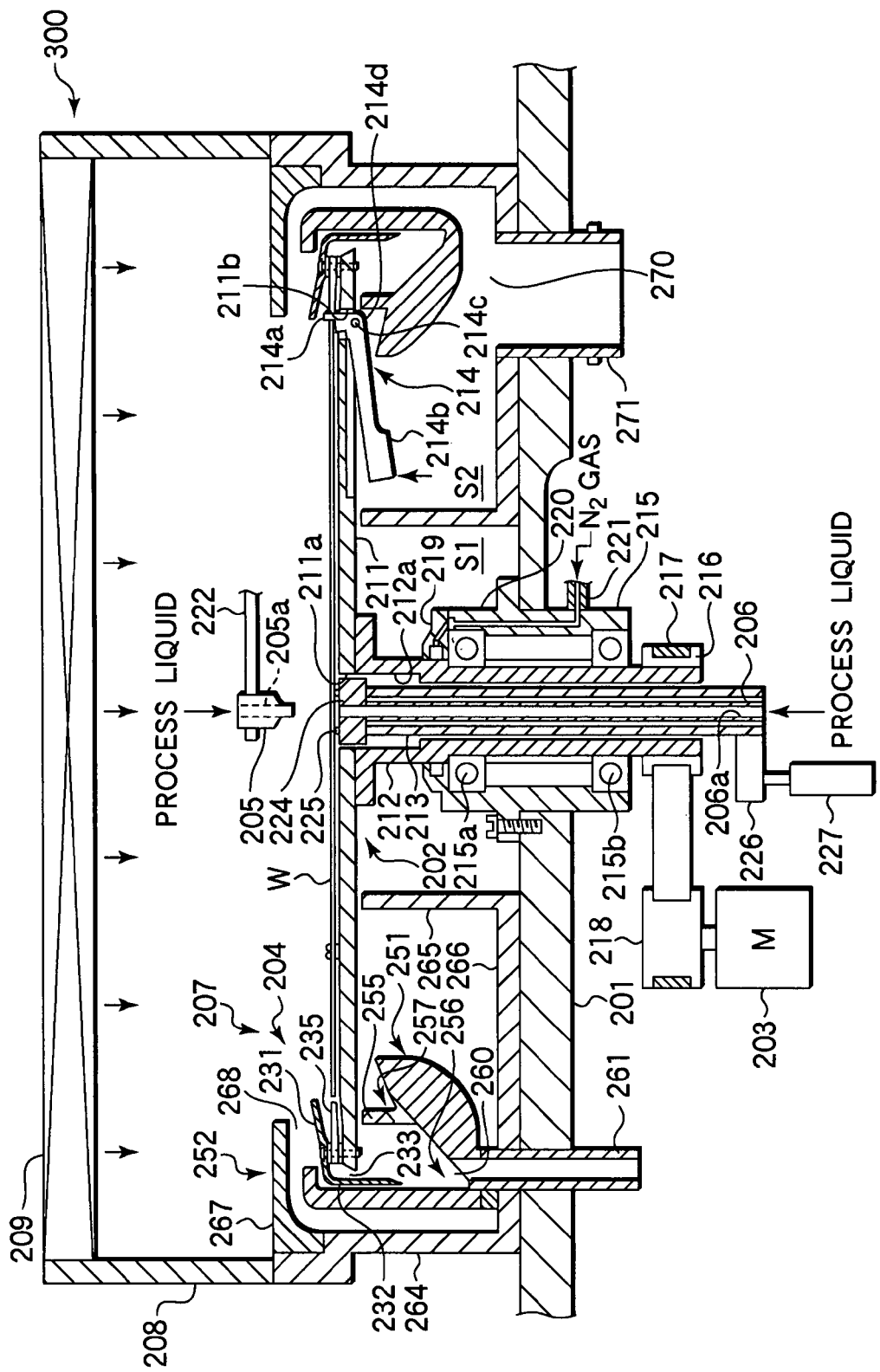
FIG. 9 is a sectional view schematically showing the structure of a liquid processing apparatus according to a second embodiment of the present invention.
Figure 10:
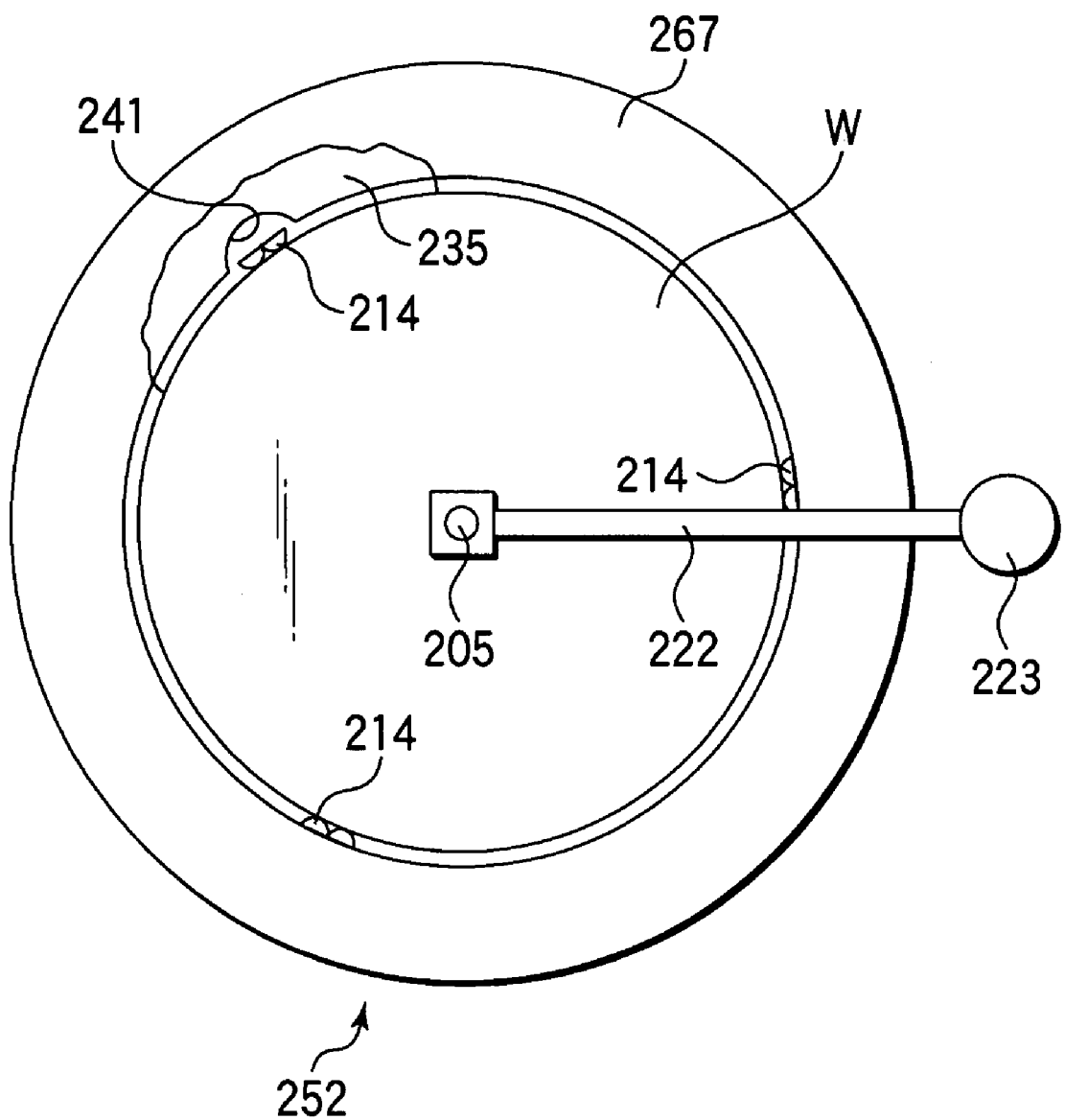
FIG. 10 is a partially sectional plan view schematically showing the liquid processing apparatus according to the second embodiment of the present invention.
Figure 11:
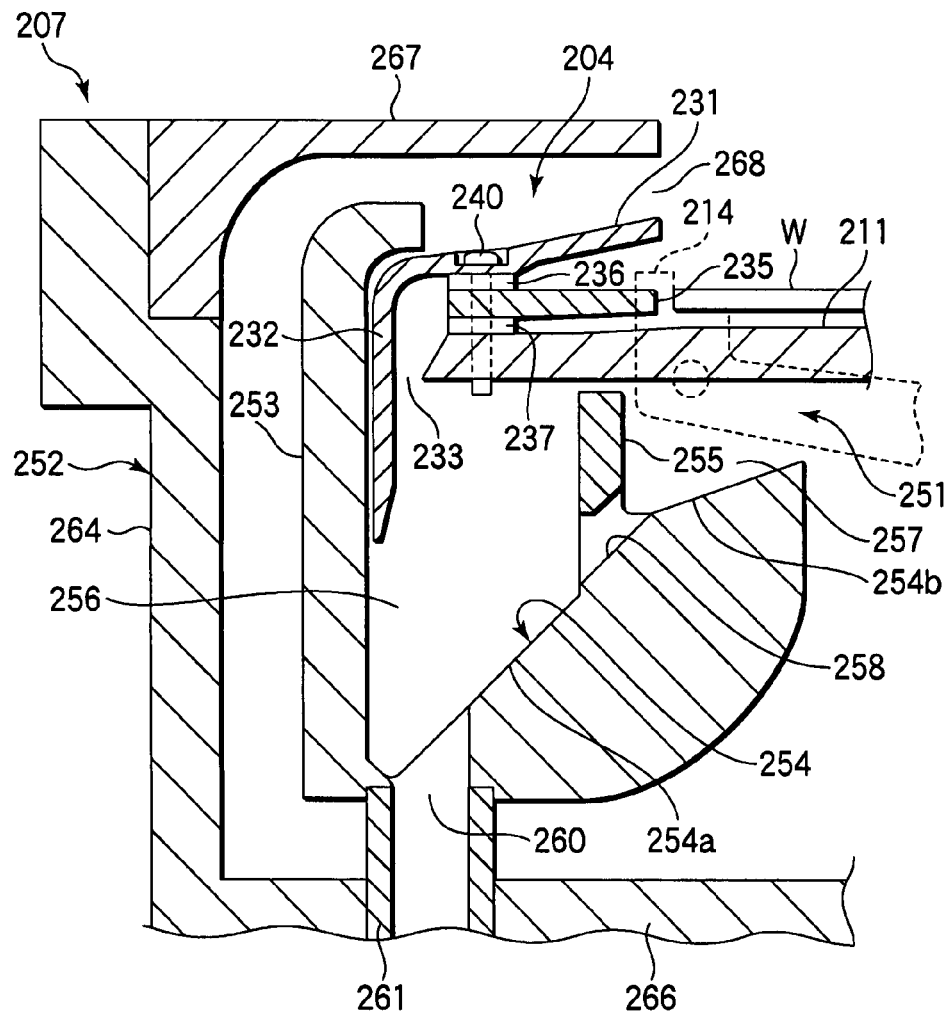
FIG. 11 is an enlarged sectional view showing an exhaust/drain section used in the liquid processing apparatus shown in FIG. 9.

The drain cup is fixed to the exhaust cup by the fixing section on the inner peripheral side, while it is not fixed on outer peripheral side that can be affected by thermal expansion. Consequently, even when the drain cup is expanded due to a high temperature process liquid, the drain cup can be hardly damaged by thermal expansion FIG. 9 is a sectional view schematically showing the structure of a liquid processing apparatus according to an embodiment of the present invention. FIG. 10 is a plan view thereof, and FIG. 11 is an enlarged sectional view of an exhaust/drain section. This liquid processing apparatus 300 includes a base plate 201 and a wafer holding member 202 for rotatably holding a target substrate or wafer W. The wafer holding member 202 is rotatable by a rotary motor 203. A rotary cup 204 is disposed around the wafer W held oh the wafer holding member 202 and configured to rotate along with the wafer holding member 202. The liquid processing apparatus 300 further includes a front surface process liquid supply nozzle 205 for supplying a process liquid onto the front surface of the wafer W, and a back surface process liquid supply nozzle 206 for supplying a process liquid onto the back surface of the wafer W. Further, an exhaust/drain section 207 is disposed around the rotary cup 204. A casing 208 is disposed to cover the area around the exhaust/drain section 207 and the area above the wafer W. The casing 208 is provided with a fan/filter unit (FFU) 209 at the top, so that clean air is supplied as a down flow onto the wafer W held on the wafer holding member 202.

The wafer holding member 202 includes a rotary plate 211 formed of a circular plate set in a horizontal state. The center of the bottom of the rotary plate 211 is connected to a cylindrical rotary shaft 212 extending vertically downward. The rotary plate 211 has a circular opening 211a at the center, which communicates with a bore 212a formed inside the rotary shaft 212. An elevating member 213 supporting the back surface process liquid supply nozzle 206 is movable up and down through the bore 212a and opening 211a. As shown in FIG. 10, the rotary plate 211 is provided with three holding accessories (accessories for holding the wafer) 214 disposed at regular intervals for holding the outer edge of the wafer W. The holding accessories 214 are configured to hold the wafer W in a horizontal state such that the wafer W is slightly separated from the rotary plate 211. Each of the holding accessories 214 includes a holding portion 214a configured to hold the edge of the wafer W, an operation lever 214b extending from the holding portion 214a toward the center of the lower surface of the rotary plate, a pivot shaft 214c that supports the holding portion 214a to be vertically rotatable, and a shaft support portion 214d that holds the pivot shaft 214c. When the distal end of the operation lever 214b is pushed up by a cylinder mechanism (not shown), the holding portion 214a is rotated outward and cancels the hold on the wafer W. Each holding accessory 214 is biased by a spring (not shown) toward a direction for the holding portion 214a to hold the wafer W, so that the holding accessory 214 can hold the wafer W when the cylinder mechanism does not act thereon.

The rotary shaft 212 is rotatably supported by the base plate 201 through a bearing mechanism 215 having two bearings 215a and 215b. The rotary shaft 212 is provided with a pulley 216 fitted thereon at the lower end. The shaft of the motor 203 is also provided with a pulley 218 fitted thereon. A belt 217 is wound around between these pulleys 216 and 218. The rotary shaft 212 is rotated through the pulley 218, belt 217, and pulley 216 by rotation of the motor 203.

An annular purge gas supply port 219 is disposed directly above the bearing mechanism 215 to surround the outer surface of the rotary shaft 212. The purge gas supply port 219 is connected to a purge gas passage 220 formed in the outer wall of the bearing mechanism 215 and extends in a vertical direction. The purge gas passage 220 is connected to a purge gas tube 221 at a position below the base plate 201 of the bearing mechanism 215. A purge gas, such as $N_2$ gas, is supplied from a purge gas supply source (not shown) through the purge gas tube 221 and purge gas passage 220 to the purge gas supply port 219. Then, the purge gas is supplied from the purge gas supply port 219 and flows upward and downward along the rotary shaft 212.

The purge gas delivered upward from the purge gas supply port 219 flows into a space S1 defined by a partition wall 265 around the rotary shaft 212, and sets this space S1 at a positive pressure. The positive pressure blocks the inflow of mist or process liquid from a space S2 outside the partition wall 265 where a chemical atmosphere is formed by various process liquid components. Consequently, the mist or process liquid is prevented from being deposited on the upper side of the rotary shaft 212 made of a metal that can be easily corroded, so that the rotary shaft 212 is protected from corrosion.

On the other hand, the purge gas delivered downward from the purge gas supply port 219 flows around the upper and lower bearings 215a and 215b inside the bearing member 215, and is then exhausted outside from the apparatus. This flow carries particles, generated due to abrasion of the bearings 215a and 215b, out of the apparatus. Consequently, the particles generated from the bearings 215a and 215b are prevented from reaching the wafer W.

The front surface process liquid supply nozzle 205 is supported by a nozzle arm 222. A process liquid is supplied through a liquid supply tube (not shown) into the nozzle 205 and is then delivered from a nozzle hole 205a formed in the nozzle 205. For example, the process liquid thus delivered encompasses a cleaning chemical solution, a rising liquid such as purified water, and a drying solvent such as IPA. In other words, the nozzle 205 is configured to selectively deliver process liquids of one, two, or more types. As shown in FIG. 10, the nozzle arm 222 is rotatable about a shaft 223 used as a central axis, and is movable by a driving mechanism (not shown) between a delivery position above the center of the wafer W and a retreat position outside the wafer W. Further, the nozzle arm 222 is movable up and down, such that the arm 222 is set at an upper position when it is rotated between the retreat position and delivery position, and at a lower position when a process liquid is delivered from the front surface process liquid supply nozzle 205.

The back surface process liquid supply nozzle 206 has a nozzle hole 206a formed through the center of the elevating member 213 and extending in the longitudinal direction. A predetermined process liquid is supplied through a process liquid tube (not shown) into the nozzle hole 206a from below and is then delivered from the nozzle hole 206a onto the back surface of the wafer W. For example, the process liquid thus delivered encompasses a cleaning chemical solution, a rising liquid such as purified water, and a drying solvent such as IPA, as in the front surface process liquid supply nozzle 205. In other words, the nozzle 206 is configured to selectively deliver process liquids of one, two, or more types. The elevating member 213 includes a wafer support head 224 at the top for supporting the wafer W. The wafer support head 224 is provided with three wafer support pins 225 for supporting the wafer W (only two of them are shown) on the upper surface. The lower end of the back surface process liquid supply nozzle 206 is connected to a cylinder mechanism 227 through a connector 226. The elevating member 213 is movable up and down by the cylinder mechanism 227 to move up and down the wafer W for loading and unloading the wafer W.

As shown in FIG. 11, the rotary cup 204 includes an annular eaves portion 231 inclined to extend inward and upward from a position above the end of the rotary plate 211 and a cylindrical outer wall portion 232 extending vertically downward from the outer end of the eaves portion 231. An annular gap 233 is formed between the outer wall portion 232 and rotary plate 211, so that a process liquid (mist) scattered by rotation of the wafer W along with the rotary plate 211 and rotary cup 204 is guided downward through the gap 233.

Figure 12:
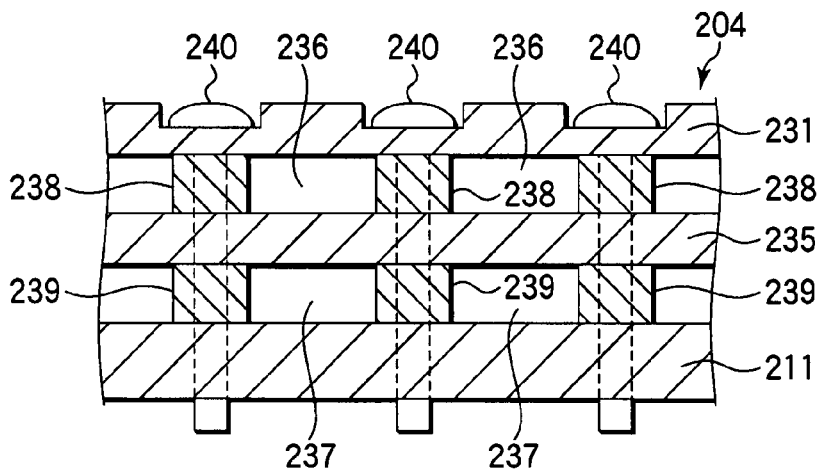
FIG. 12 is a view for explaining the arrangement of a rotary cup and a guide member used in the liquid processing apparatus shown in FIG. 9.

A plate-like guide member 235 is disposed between the eaves portion 231 and rotary plate 211 at a height essentially the same as the wafer W. As shown in FIG. 12, a plurality of spacers 238 and 239 are disposed in an annular direction between the eaves portion 231 and guide member 235 and between the guide member 235 and rotary plate 211 to form openings 236 and 237 for allowing the process liquid to pass therethrough. The eaves portion 231, guide member 235, rotary plate 211, and spacers 238 and 239 are fixed to each other by screws 40.

The guide member 235 is arranged such that the upper and lower surfaces thereof are to be almost continued to the front and back surfaces of the wafer W. When a process liquid is supplied onto the center of the front surface of the wafer W from the front surface process liquid supply nozzle 205 while the wafer holding member 202 and rotary cup 204 are rotated along with the wafer W by the motor 203, the process liquid is spread by a centrifugal force on the front surface of the wafer W and is thrown off from the peripheral edge of the wafer W. The process liquid thus thrown off from the front surface of the wafer W is guided by the upper surface of the guide member 235 almost continued thereto. Then, the process liquid is discharged outward through the openings 236, and is guided downward by the eaves portion 231 and outer wall portion 232. Similarly, when a process liquid is supplied onto the center of the back surface of the wafer W from the back surface process liquid supply nozzle 206 while the wafer holding member 202 and rotary cup 204 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the guide member 235 almost continued thereto. Then, the process liquid is discharged outward through the openings 237, and is guided downward by the eaves portion 231 and outer wall portion 232. At this time, since a centrifugal force acts on the process liquid guided to the spacers 238 and 239 and outer wall portion 232, mist of the process liquid is inhibited from returning inward.

Further, since the process liquid thrown off from the front and back surfaces of the wafer W is guided by the guide member 235, the process liquid separated from the peripheral edge of the wafer W can hardly become turbulent. In this case, it is possible to guide the process liquid out of the rotary cup while preventing the process liquid from being turned into mist. As shown in FIG. 10, the guide member 235 has notches 41 at positions corresponding to the holding accessories 214 to accept the holding accessories 214.

The exhaust/drain section 207 is mainly used for collecting exhaust gas and drainage discharged from the space surrounded by the rotary plate 211 and rotary cup 204. As shown in the enlarged view of FIG. 11, the exhaust/drain section 207 includes an annular drain cup 251 disposed to receive the process liquid discharged from the rotary cup 204, and an annular exhaust cup 252 disposed outside the drain cup 251 to surround the drain cup 251.

As shown in FIGS. 9 and 11, the drain cup 251 includes a vertical wall 253 disposed outside the rotary cup 204 adjacent to the outer wall portion 232, and a bottom portion 254 extending inward from the lower end of the vertical wall 253. The upper side of the vertical wall 253 extends to a position above the outer wall portion 232 of the rotary cup 204 and is curved along the eaves portion 231. This arrangement is conceived to prevent mist from flowing backward from inside the drain cup 251 toward the wafer W.

The bottom portion 254 of the annular drain cup 251 is inclined upward and inward (toward the rotational center of the wafer W). The inner side of the bottom portion 254 extends inward (toward the rotational center) further from a position corresponding to the holding portions 214a of the holding accessories 214.

The drain cup 251 is provided with an annular (cylindrical) shielding wall 255 disposed therein in an annular direction outside the holding accessories 214 and extending from the bottom portion 254 to a position near the lower surface of the rotary plate 211. The shielding wall 255 serves to prevent stray winds, generated in the space S2 below the rotary plate 211, from flowing outward relative to the drain cup 251 (in a direction away from the rotary shaft 212). The interior of the drain cup 251 is divided by the shielding wall 255 into a main liquid receiving portion 256 and an auxiliary liquid receiving portion 257. The main liquid receiving portion 256 is used for receiving the process liquid discharged from the gap 233, while the auxiliary liquid receiving portion 257 is used for receiving the process liquid dropping from portions near the holding portions 214a of the holding accessories 214. Thus, the shielding wall 255 also serves as a separator (partition wall) to partition the two liquid receiving portions for receiving the process liquid.

The holding portions 214a of the holding accessories 214 are rotatable about the pivot shaft 214c used as the rotational center to hold the wafer W and cancel the hold on the wafer W, so the rotary plate 211 has holes 211b for inserting the holding portions 214a. The process liquid flows through the holes 211b of the rotary plate 211 to the back side (lower surface) of the rotary plate 211, and drops downward into the auxiliary liquid receiving portion 257. The shielding wall 255 has a hole 258 formed therein as a communication port to guide the process liquid from the auxiliary liquid receiving portion 257 to the main liquid receiving portion 256.

The drain cup 251 has a drain port 260 formed in the bottom portion 254 at one position on the outermost side and connected to a drain tube 261. The drain tube 261 is connected to a suction mechanism through a drain-switching member (both not shown), so that process liquids are separately collected or discarded in accordance with the types thereof. In place of a single drain port 260, a plurality of drain ports 260 may be formed in accordance with the types of process liquids.

The exhaust cup 252 includes an outer wall 264 vertically extending outside the vertical wall 253 of the drain cup 251, and a partition wall 265 disposed on the inward side from the holding accessories 214 and vertically extending to have an upper end adjacent to the rotary plate 211. The exhaust cup 252 further includes a bottom wall 266 placed on the base plate 201, and a top wall 267 extending upward and curved from the outer wall 264 to cover an area above the rotary cup 204. As described previously, the partition wall 265 serves as a wall for separating the atmosphere in the inner side space S1 around the rotary shaft 212 from that in the outer side space S2. The exhaust cup 252 is mainly used for collecting and exhausting gas components from inside and around the rotary cup 204 through an annular inlet port 268 formed between the upper wall 267 and eaves portion 231 of the rotary cup 204. As shown in FIG. 9, the exhaust cup 252 has exhaust ports 70 formed in the bottom and each connected to an exhaust tube 71. The exhaust tube 71 is connected to a suction mechanism (not shown) on the downstream side, so that gas is exhausted from around the rotary cup 204. The plurality of exhaust ports 70 can be selectively used by switching in accordance with the types of process liquids.

As described above, the process liquid is guided by the rotary cup 204 to the drain cup 251, and gas components are guided from the inlet port 268 to the exhaust cup 252. In this case, the liquid-draining from the drain cup 251 is performed independently of the gas-exhausting from the exhaust cup 252, so that drainage and exhaust gas are guided separately from each other. Further, since the exhaust cup 252 is disposed to surround the drain cup 251, mist leaked out of the drain cup 251 is swiftly discharged from the exhaust port 70, so that the mist is reliably prevented from diffusing outside.

As described above, the bottom portion 254 of the drain cup 251 is inclined upward and inward (toward the rotational center). Accordingly, the inside bottom surface 254a of the main liquid receiving portion 256 and the inside bottom surface 254b of the auxiliary liquid receiving portion 257 are also inclined upward and inward (toward the rotational center). The auxiliary liquid receiving portion 257 is set to be shallower than the main liquid receiving portion 256. This arrangement relates to the amount of process liquid received by the main liquid receiving portion 256 and auxiliary liquid receiving portion 257. Specifically, the amount of process liquid flowing through the holes 211b of the rotary plate 211 to the back side (lower surface) is smaller than that of the amount of process liquid received by the main liquid receiving portion 256, so the main liquid receiving portion 256 is preferably set to have a volume larger than that of the auxiliary liquid receiving portion 257.

The shielding wall 255 serves to prevent stray winds (for example, a circular current), generated by the portions of the holding accessories 214 protruding downward below the rotary plate 211, from involving and transferring mist onto the wafer W.

Specifically, each of the holding accessories 214 extends from the holding portion 214a to the operation lever 214b on the opposite side while protruding downward toward the center of the lower surface of the rotary plate 211. When the rotary plate 211 is rotated, the holding accessories 214 act as fins and generate stray winds in the space below the rotary plate 211. The stray winds thus generated may disturb exhaust gas flowing in one direction toward exhaust ports 270 within the exhaust cup 252. Consequently, mist contained in the exhaust gas may diffuse and generate water marks and/or particles on the front surface of the wafer W. In this respect, according to this embodiment, the cylindrical shielding wall 255 is disposed to surround the holding accessories 214 and prevent stray winds, generated by rotational movement of the holding accessories 214 along with the rotary plate 211, from heading outward in the radial direction thereby disturbing the normal exhaust gas flow.

Further, in order to reliably collect the process liquid flowing through the holes 211b of the rotary plate 211 to the back side (lower surface), the drain cup 251 preferably covers a range from the outer peripheral side of the rotary plate 211 to a position directly below the holes 211b of the rotary plate 211. Accordingly, the process liquid receiving portion (concave) of the drain cup 251 is expanded inward, but this expanded concave may be therefore affected by stray winds generated in the space below the rotary plate 211. In other words, when the rotary plate 211 is rotated, the portions of the holding accessories 214 protruding downward below the rotary plate 211 generate stray winds, which may disturb the process liquid flowing within the concave of the drain cup 251, thereby generating mist.

In light of the things described above, the drain cup 251 according to this embodiment is provided with the shielding wall 255 to divide the process liquid receiving portion of the drain cup 251 into the main liquid receiving portion 256 and auxiliary liquid receiving portion 257. This arrangement prevents the stray winds generated as described above from disturbing the process liquid flowing within the main liquid receiving portion 256 of the drain cup 251, so as to prevent mist generation and to maintain the normal drainage flow. As shown in FIGS. 9 and 11, the main liquid receiving portion 256 and auxiliary liquid receiving portion 257 of the drain cup 251 partitioned by the shielding wall 255 are grooves (annular concaves) each essentially having a V-shape in a cross section. These grooves respectively have the drain port 260 and the communication port or hole 258 formed at the bottom, so that the process liquid can be swiftly led to the drain port 260. Further, since the shielding wall 255 shields stray winds, the stray winds are prevented from reaching the exhaust routes or disturbing the normal exhaust gas flow within the exhaust cup 252.

As described above, the shielding wall 255 thus arranged allows both of the exhaust gas within the exhaust cup 252 and the drainage within the drain cup 251 to be less affected by stray winds generated by rotation of the holding accessories 214. Consequently, it is possible to improve the efficiency of the liquid processing apparatus 300 in the gas-exhausting and liquid-draining, while suppressing mist generation and particle contamination, so as to provide the liquid processing apparatus with high reliability.

Figure 13A:
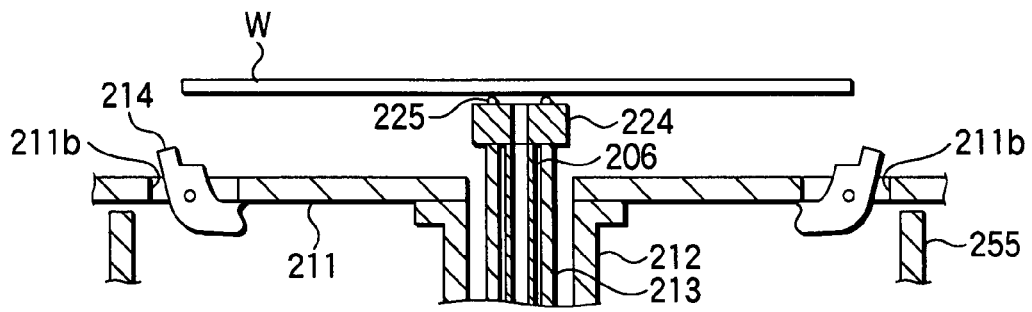
FIGS. 13A to 13D are views for explaining an operation of the liquid processing apparatus according to the second embodiment of the present invention.
Figure 13B:
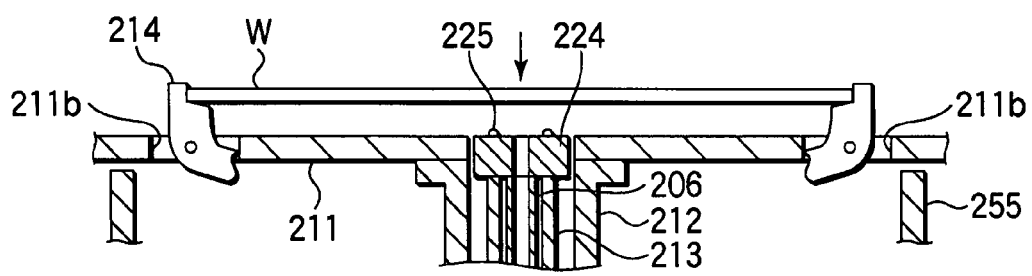
Figure 13C:
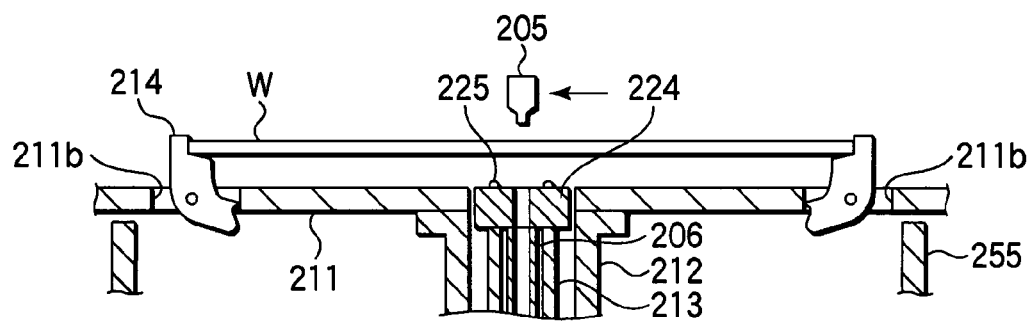

Next, an explanation will be given, with reference to FIGS. 13A to 13D, of an operation of the liquid processing apparatus 300 having the structure described above. At first, as shown in FIG. 13A, the elevating member 213 is set at the upper position, and a wafer W is transferred from a transfer arm (not shown) onto the support pins 225 of the wafer support head 224. Then, as shown in FIG. 13B, the elevating member 213 is moved down to a position where the wafer W can be held by the holding accessories 214, and then the wafer W is chucked by the holding accessories 214. Then, as shown in FIG. 13C, the front surface process liquid supply nozzle 205 is moved from the retreat position to the delivery position above the center of the wafer W.

Figure 13D:
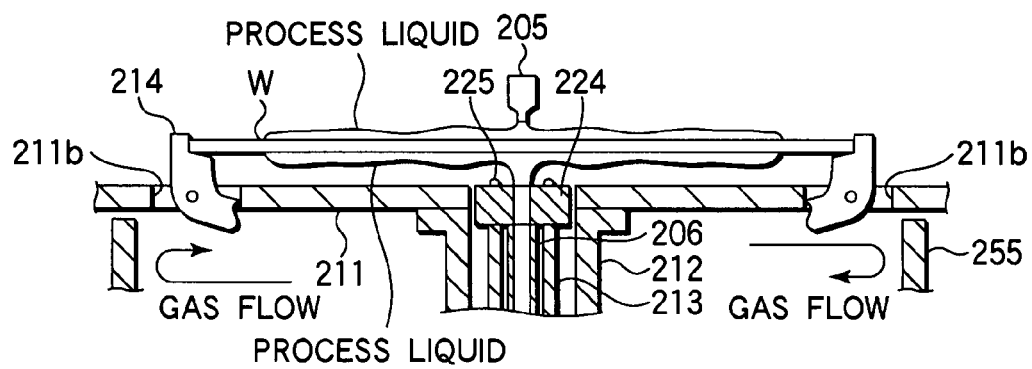

In this state, as shown in FIG. 13D, while the rotary plate 211 is rotated along with the rotary cup 204 and wafer W by the motor 203, a predetermined process liquid is supplied from the front surface process liquid supply nozzle 205 and back surface process liquid supply nozzle 206 to perform a cleaning process.

In this cleaning process, the process liquid is supplied onto the center of the front surface and back surface of the wafer W, and is spread by a centrifugal force outward on the wafer W and thrown off from the peripheral edge of the wafer W. The cup surrounding the wafer W used in this process is the rotary cup 204 that is rotated along with the wafer W. Accordingly, when the process liquid thrown off from the wafer W hits against the rotary cup 204, a centrifugal force acts on the process liquid, and the process liquid is thereby inhibited from being scattered (turned into mist), unlike a case where a stationary cup is used for the same purpose. Then, the process liquid is guided downward by the rotary cup 204, and is discharged through the gap 233 into the main liquid receiving portion 256 of the drain cup 251. Further, since the rotary plate 211 has holes for inserting the holding portions 214a at positions where the holding accessories 214 are attached, the process liquid drops through the holes into the auxiliary liquid receiving portion 257 of the drain cup 251.

When cleaning is performed on the wafer W, since the process liquid is discharged through the annular gap 233 while the rotary cup 204 is being rotated, the drain cup 251 for receiving the process liquid needs to be annular.

Where the process liquid is discharged from the annular drain cup 251 in a short time, it becomes easier to find the timing of switching between drain passages of process liquids of different kinds. Further, it is possible to prevent two process liquids of different kinds used before and after the switching therebetween from being drained together in a mixed state.

In this case, the bottom portion 254 of the drain cup 251 (i.e., the inside bottom surface 254a of the main liquid receiving portion 256 and the inside bottom surface 254b of the auxiliary liquid receiving portion 257) is inclined radially inward and upward, and the process liquid discharged into the main liquid receiving portion 256 and auxiliary liquid receiving portion 257 swiftly flows to an outer side, so residual liquid can be hardly generated. The shielding wall 255 for shielding stray winds is disposed to block stray winds generated by the holding accessories 214 mainly when the rotary plate 211 is rotated, so as to prevent the stray winds from disturbing the process liquid flowing within the drain cup 251. Further, the shielding wall 255 prevents the stray winds from reaching the exhaust routes or disturbing the normal exhaust gas flow within the exhaust cup 252, so as to suppress diffusion of mist and/or particles.

Figure 14:
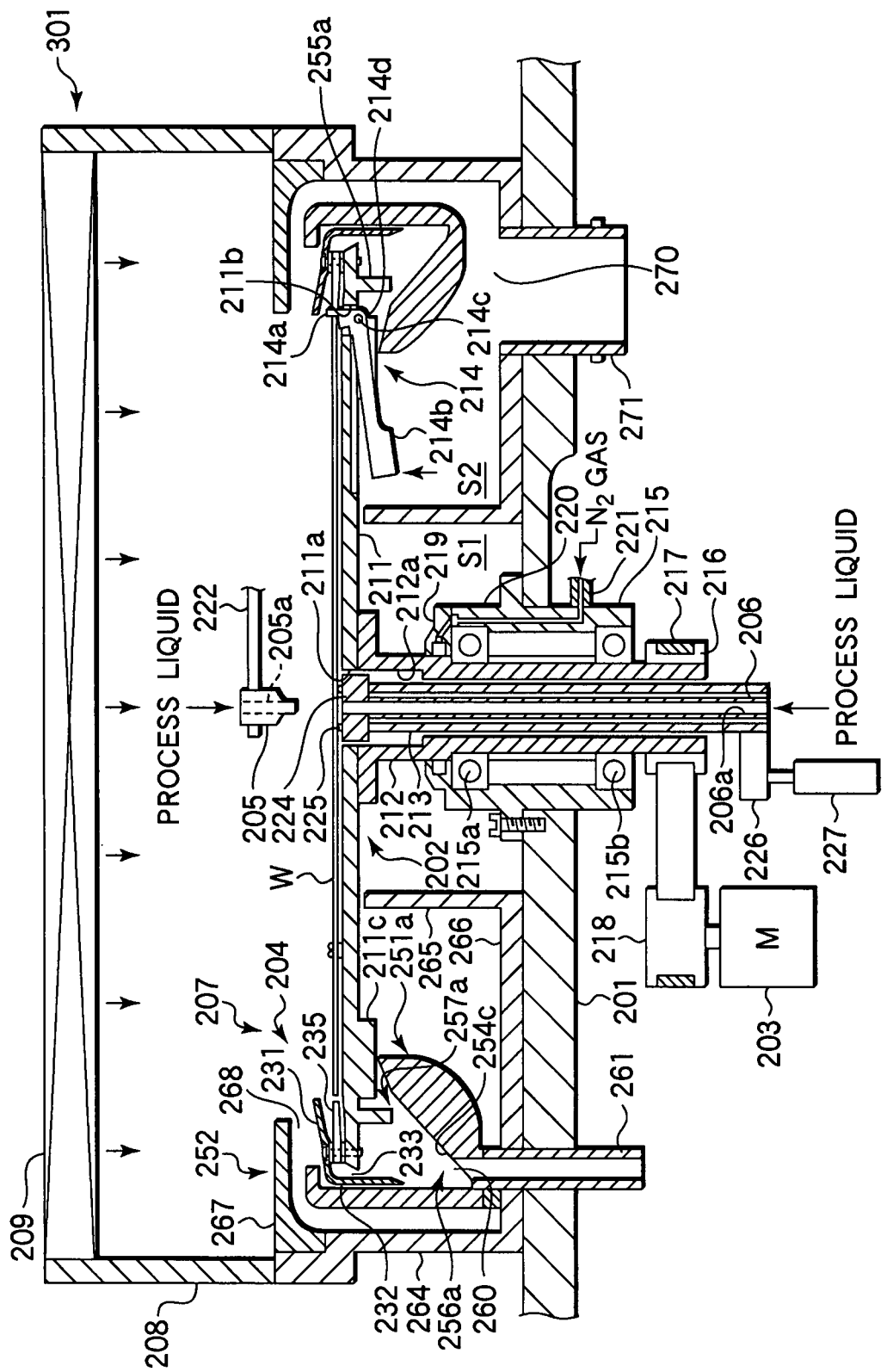
FIG. 14 is a sectional view schematically showing the structure of a liquid processing apparatus according to a modification of the second embodiment of the present invention.

FIG. 14 is a sectional view schematically showing the structure of a liquid processing apparatus 301 according to a modification of the second embodiment of the present invention. In the liquid processing apparatus 300 shown in FIG. 9, the shielding wall 255 is disposed to extend from the bottom portion 254 of the drain cup 251 and to divide the process liquid receiving portion into the main liquid receiving portion 256 and auxiliary liquid receiving portion 257. In the liquid processing apparatus 301 shown in FIG. 14, a cylindrical shielding wall 255a is disposed to extend downward from the rotary plate 211. The shielding wall 255a is located near the outer peripheral side of the rotary plate 211 outside the holes 211b, and extends to have a lower end adjacent to the bottom portion 254c of the drain cup 251a. Accordingly, the drain cup 251a is not provided with the shielding wall 255 of the liquid processing apparatus 300 shown in FIG. 9.

The shielding wall 255a provides essentially the same function as that of the shielding wall 255 of the liquid processing apparatus 300 shown in FIG. 9. Specifically, the shielding wall 255a serves to shield stray winds generated in the space S2, so as to prevent the stray winds from reaching the exhaust routes or disturbing the normal exhaust gas flow within the exhaust cup 252. The shielding wall 255a divides the process liquid receiving portion of the drain cup 251a into a main liquid receiving portion 256a and an auxiliary liquid receiving portion 257a. This arrangement prevents stray winds, generated in the space S2 by rotational movement of the holding accessories 214, from disturbing the process liquid flowing within the main liquid receiving portion 256a of the drain cup 251, so as to prevent mist generation and to maintain the normal drainage flow. In this modification, the main liquid receiving portion 256a and auxiliary liquid receiving portion 257a of the drain cup 251 partitioned by the shielding wall 255a communicate with each other through a gap formed between the lower end of the shielding wall 255a and the bottom portion 254c of the drain cup 251a. Accordingly, the process liquid dropping into the auxiliary liquid receiving portion 257a swiftly flows downward (from a side closer to the rotational center of the wafer W) to the main liquid receiving portion 256a through the bottom portion 254c inclined toward the outer peripheral side. Then, the process liquid is swiftly led to a drain port 260 formed at the bottom of the main liquid receiving portion 256a, which is a groove (annular concave) essentially having a V-shape in a cross section.

Figure 15:
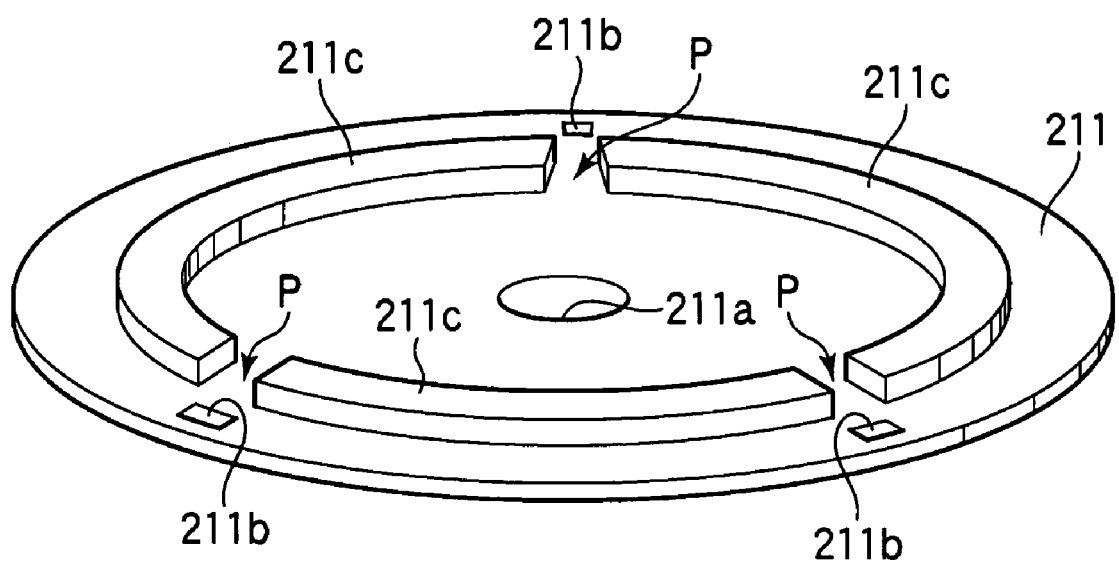
FIG. 15 is a perspective view showing the structure of the lower surface of a rotary plate according to the modification of the second embodiment.
Figure 16:
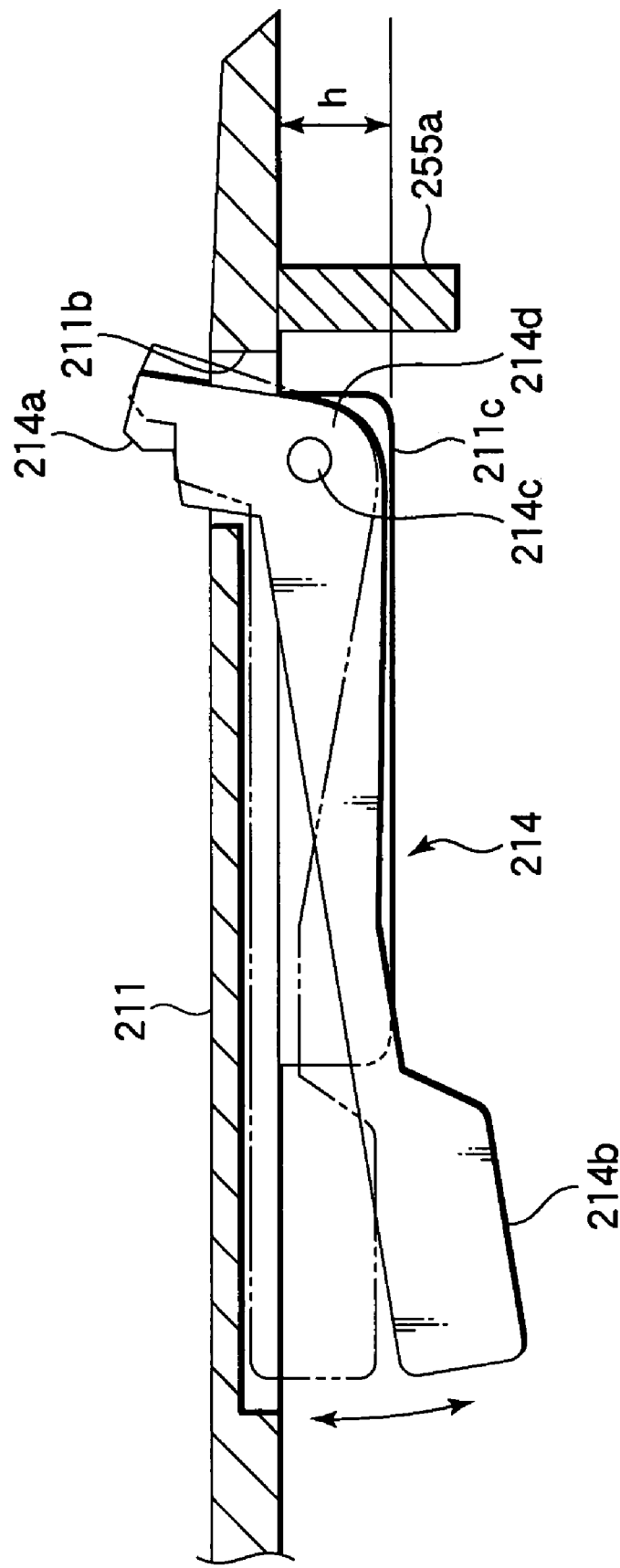
FIG. 16 is a sectional view showing a main portion of a rotary plate according to the modification of the second embodiment.

Further, in the liquid processing apparatus 301 according to this modification, the lower surface of the rotary plate 211 is provided with arc-like protrusions 211c for suppressing generation of stray winds. FIG. 15 is a perspective view showing the structure of the lower surface of the rotary plate 211. FIG. 16 is a sectional view showing a main portion of the rotary plate 211 including the protrusions 211c. A plurality of (three in this modification) protrusions 211c are disposed to sandwich the attaching positions P of the holding accessories 214. When the rotary plate 211 is rotated, stray winds, such as a circular current, are generated in the space S2, because the portions of the relatively large holding accessories 214 protruding downward below the rotary plate 211 act as agitation fins by rotational movement. Accordingly, where the protrusions 211c are formed on the lower surface of the rotary plate 211 at positions along the same circular track as the holding accessories 214, the agitation performance of the holding accessories 214 can be attenuated to suppress generation of stray winds. In order to obtain such effect of suppressing generation of stray winds, the height "h" of the protrusions 211c is preferably set to be equal to or higher than the shaft support portions 214d of the holding accessories 214. The protrusions 211c may be hollow or solid, or may be formed integrally with the rotary plate 211 or separately formed and bonded to the lower surface of the rotary plate 211.

As described above, the shielding wall 255a thus arranged on the rotary cup 211 side allows both of the exhaust gas within the exhaust cup 252 and the drainage within the drain cup 251 to be less affected by stray winds generated in the space S2 by rotation of the holding accessories 214. In addition to the shielding wall 255a, the lower surface of the rotary plate 211 is provided with means for suppressing stray winds (protrusions 211c) to attenuate the agitation performance of the holding accessories 214, so the intensity of stray winds becomes lower. Consequently, it is possible to improve the efficiency of the liquid processing apparatus 301 in the gas-exhausting and liquid-draining, while suppressing mist generation and particle contamination, so as to provide the liquid processing apparatus with high reliability. This means for suppressing stray winds (protrusions 211c) may be applied to the liquid processing apparatus 300 shown in FIG. 9.

Figure 17:
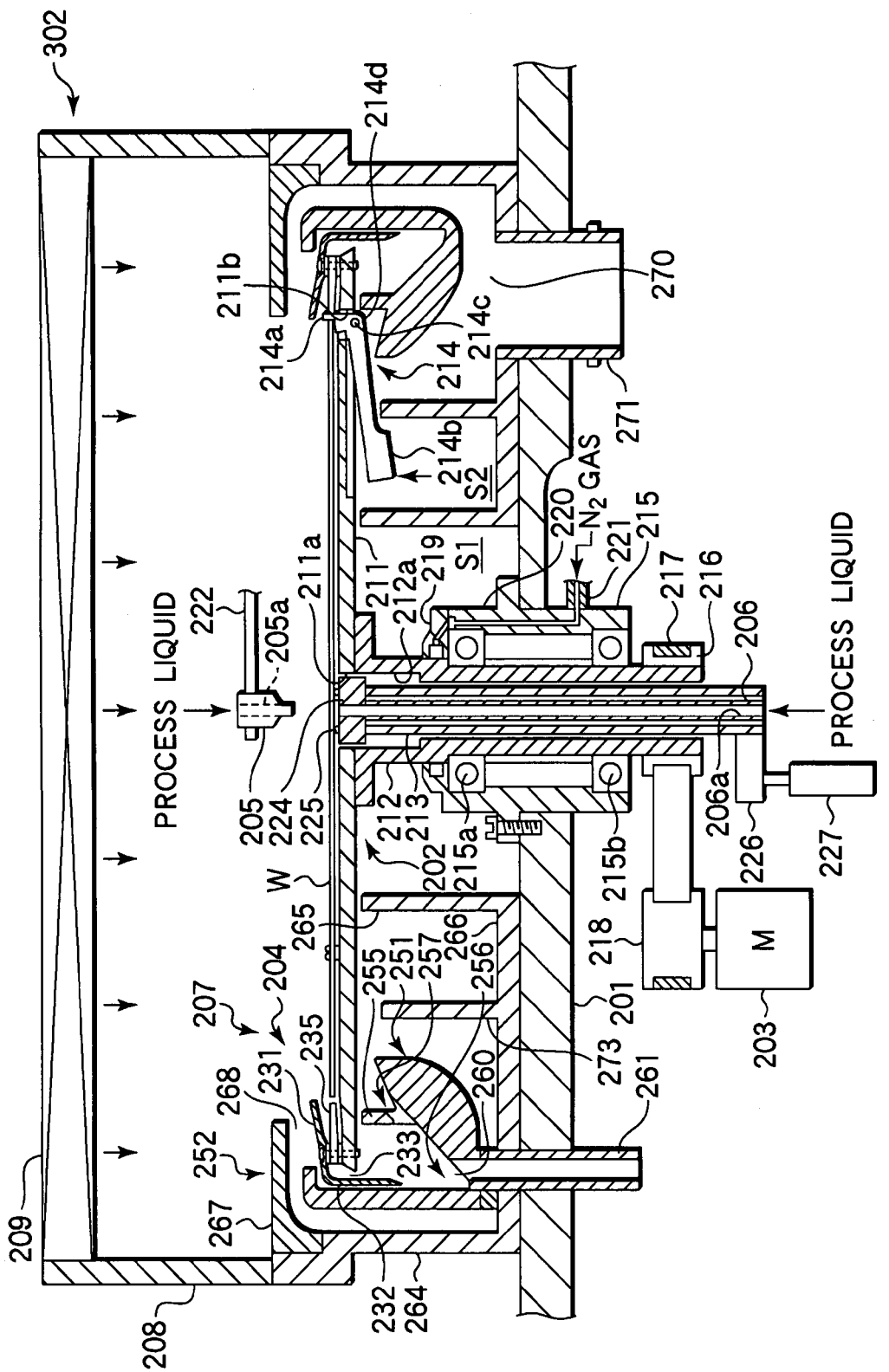
FIG. 17 is a sectional view schematically showing the structure of a liquid processing apparatus according to another modification of the second embodiment of the present invention.

FIG. 17 is a sectional view schematically showing the structure of a liquid processing apparatus 302 according to another modification of the second embodiment of the present invention. In the liquid processing apparatus 302 shown in FIG. 17, a second shielding wall 273 is additionally disposed on the inward side (closer to the rotary shaft 212) from the shielding wall 255 at a position below the shielding wall 255. The second shielding wall 273 is formed of a cylindrical wall extending from the bottom wall 266 placed on the base plate 201. This second shielding wall 273 is located directly below the holding accessories 214 and has an upper end adjacent to the holding accessories 214. When the rotary plate 211 is rotated, the second shielding wall 273 serves to prevent stray winds, generated in the space S2 by rotation of the holding accessories 214, from heading toward the drain cup 251 and the exhaust routes outside the drain cup 251. In order to enhance the effect of shielding stray winds, the distance between the shielding wall 273 and holding accessories 214 is preferably set to be smaller, as long as the shielding wall 273 does not come into contact with the holding accessories 214 being moved along a circular track.

The second shielding wall 273 further prevents stray winds generated in the space S2 from flowing through a position below the drain cup 251 into the exhaust ports 270. If stray winds generated in the space S2 directly flow into the exhaust ports 270, the exhaust gas flow toward the exhaust ports 270 is thereby disturbed, wherein the gas flow is formed of gas components collected through the inlet port 268 between the upper wall 267 of the exhaust cup 252 and the eaves portion 231 of the rotary cup 204. In this case, mist contained in the exhaust gas may diffuse and generate water marks and/or particles on the wafer W. The second shielding wall 273 can eliminate such an ill effect of stray winds, thereby facilitating the normal exhaust gas flow.

A cylinder mechanism (not shown) is disposed near the holding accessories 214 to push up the operation levers 214b of the holding accessories 214. The second shielding wall 273 prevents mist or process liquid from being scattered from the drain cup 251 onto the cylinder mechanism (which may cause corrosion).

As described above, the liquid processing apparatus 302 according to this modification has a double-shielding structure formed of the shielding wall 255 and the additional second shielding wall 273. This structure allows both of the exhaust gas within the exhaust cup 252 and the drainage within the drain cup 251 to be less affected by stray winds generated in the space S2. Consequently, it is possible to improve the efficiency of the liquid processing apparatus 302 in the gas-exhausting and liquid-draining, while suppressing mist generation and particle contamination, so as to provide the liquid processing apparatus with high reliability. The second shielding wall 273 of the liquid processing apparatus 302 shown in FIG. 17 may be applied to the liquid processing apparatus 301 shown in FIG. 14.

According to the second embodiment of the present invention described with reference to FIGS. 9 to 17, the shielding wall is located outside the holding accessories in the radial direction relative to the rotational center of the substrate holding member for rotating the substrate held by the holding accessories. The shielding wall allows the exhaust gas flow and drainage flow to be less affected by stray winds generated below the substrate holding member. Consequently, it is possible to efficiently perform the gas-exhausting and liquid-draining, while suppressing generation of mist and/or particles in the liquid processing apparatus. In the second embodiment, the rotary cup 204 is rotated along with the rotary plate 211, but a stationary liquid receiving cup may be alternatively used to surround a wafer W held on the rotary plate 211.

The present invention is not limited to the embodiments described above, and it may be modified in various manners. For example, the embodiments described above are exemplified by a liquid processing apparatus for cleaning the front and back surfaces of a wafer. However, the present invention may be applied to a liquid processing apparatus for cleaning only one of the front surface and back surfaces of a wafer. Further, in place of a cleaning process, the present invention may be applied to a liquid processing apparatus for performing another liquid process, such as a resist liquid coating process and/or a subsequent development process. In the embodiments described above, the target substrate is exemplified by a semiconductor wafer, but the present invention may be applied to another substrate, such as a substrate for flat panel display devices (FPD), a representative of which is a glass substrate for liquid crystal display devices (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A liquid processing apparatus comprising:
   a substrate holding member configured to rotate along with a substrate held thereon in a horizontal state;
   a rotary cup configured to surround the substrate held on the substrate holding member, to rotate along with the substrate, and to receive the process liquid thrown off from the substrate;
   a rotation mechanism configured to integrally rotate the rotary cup and the substrate holding member;
   a liquid supply mechanism configured to supply a process liquid onto the substrate;
   an annular drain cup surrounding the rotary cup and configured to receive and discharge the process liquid discharged from the rotary cup;
   an annular exhaust cup accommodating the drain cup coaxially therewith and configured to mainly collect a gas component from inside and around the rotary cup;
   an exhaust port connected to the exhaust cup to discharge the gas component collected in the exhaust cup; and
   a gas-flow adjusting mechanism disposed between the exhaust cup and the exhaust port and configured to adjust a gas flow of the gas component to flow toward the exhaust port from essentially all around within the exhaust cup,
   wherein the rotary cup has a shape substantially not to cover an area above the substrate held on the substrate holding member,
   the drain cup accommodates the rotary cup,
   the exhaust cup accommodates the drain cup coaxially therewith,
   an upper exhaust inlet port of the exhaust cup is located above the substrate holding member,
   an annular buffer space is formed coaxially with the drain cup inside the exhaust cup and connected to the exhaust port, and the upper exhaust inlet port is connected to the buffer space through an annular outer-flow resistance portion configured to apply a predetermined gas-flow resistance to an exhaust gas flow from the upper exhaust inlet port, so as to cause gas exhausted from the upper exhaust inlet port to the buffer space to be uniform essentially allover an annular direction,
   and wherein the drain cup has an inner peripheral side and an outer peripheral side both supported by a bottom wall of the exhaust cup such that the inner peripheral side is fixed to the bottom wall by a fixing section and the outer peripheral side is not fixed to the bottom wall.

2. The liquid processing apparatus according to claim 1, wherein the buffer space is present below the drain cup.

3. The liquid processing apparatus according to claim 2, wherein the exhaust port is located directly below the buffer space.

4. The liquid processing apparatus according to claim 2, wherein the buffer space is defined by a bottom portion of the drain cup recessed from below.

5. The liquid processing apparatus according to claim 1, wherein the exhaust cup includes the upper wall that covers an area above the rotary cup.

6. The liquid processing apparatus according to claim 1, wherein an annular member is disposed between the drain cup and the exhaust cup at a position corresponding to the outer gas-flow resistance portion, and the outer gas-flow resistance portion comprises a plurality of gas-flow holes formed in the annular member uniformly all over an annular direction.

7. The liquid processing apparatus according to claim 1, wherein an outer annular space is formed between an outer wall of the drain cup and an outer wall of the exhaust cup and connects the upper exhaust inlet port to the outer gas-flow resistance portion.

8. The liquid processing apparatus according to claim 1, wherein the apparatus further comprises an annular inner gas-flow resistance portion disposed between the drain cup and the exhaust cup and connecting a lower exhaust inlet port of the exhaust cup located below the substrate holding member to the buffer space essentially all over an annular direction, and the inner gas-flow resistance portion is configured to apply a predetermined gas-flow resistance to an exhaust gas flow from the lower exhaust inlet port.

9. The liquid processing apparatus according to claim 8, wherein a plurality of spacers are disposed between the drain cup and the exhaust cup at a position corresponding to the inner gas-flow resistance portion, and the inner gas-flow resistance portion comprises a plurality of openings formed between the spacers uniformly all over an annular direction.

10. The liquid processing apparatus according to claim 8, wherein an inner annular space is formed between an inner wall of the drain cup and an inner wall of the exhaust cup and connects the lower exhaust inlet port to the inner gas-flow resistance portion.

11. The liquid processing apparatus according to claim 1, wherein the fixing section connects a bottom of the drain cup to the bottom wall of the exhaust cup.

12. The liquid processing apparatus according to claim 11, wherein the drain cup includes a liquid receptacle for receiving the process liquid, and the fixing section is annular and located on an inward side from the liquid receptacle.

13. The liquid processing apparatus according to claim 12, wherein the drain cup has an annular bore portion at a bottom outside the fixing section to define a flexible annular portion extending from an upper portion of the drain cup to the fixing section.

14. The liquid processing apparatus according to claim 12, wherein the fixing section comprises a plurality of screwed portions and a plurality of positioning portions arrayed in an annular direction.

15. The liquid processing apparatus according to claim 1, wherein the outer peripheral side of the drain cup has a bottom movable in a radial direction relative to the bottom wall of the exhaust cup.

16. The liquid processing apparatus according to claim 1, wherein the substrate holding member is provided with an accessory protruding below a lower surface thereof, the drain cup includes a liquid receptacle for receiving the process liquid, and a shielding wall is disposed between the accessory and the liquid receptacle to shield a stray wind generated by the accessory.

17. The liquid processing apparatus according to claim 16, wherein the accessory is configured to hold the substrate on an upper end.

18. The liquid processing apparatus according to claim 16, wherein the shielding wall is annular to surround the accessory below the substrate holding member.

19. The liquid processing apparatus according to claim 18, wherein the shielding wall is formed on the drain cup.

20. The liquid processing apparatus according to claim 19, wherein the drain cup is partitioned by the shielding wall into the liquid receptacle and a liquid receiving portion on an inward side, and the liquid receiving portion is configured to receive the process liquid flowing onto a lower surface of the substrate holding member and connected to the liquid receptacle through a hole formed in the shielding wall.

21. The liquid processing apparatus according to claim 18, wherein the shielding wall is formed on the lower surface of the substrate holding member and extends downward.

22. The liquid processing apparatus according to claim 16, wherein a partition wall is disposed between a rotary shaft of the rotation mechanism and the shielding wall to separate an atmosphere around the rotary shaft from an atmosphere around the drain cup below the substrate holding member.

23. The liquid processing apparatus according to claim 22, wherein the apparatus further comprises a pressure adjusting mechanism configured to adjust pressure in a space partitioned by the partition wall around the rotary shaft.

24. The liquid processing apparatus according to claim 22, wherein the apparatus further comprises a gas supply portion configured to supply a purge gas into a space partitioned by the partition wall around the rotary shaft.

25. The liquid processing apparatus according to claim 22, wherein a second shielding wall is disposed directly below the accessory between the partition wall and the shielding wall to shield the stray wind.

26. The liquid processing apparatus according to claim 16, wherein the substrate holding member has a lower surface provided with a plurality of arc-like protrusions to suppress generation of a stray wind by the accessory, and the accessory is located between the protrusions.

27. A liquid processing apparatus comprising:
a substrate holding member configured to rotate along with a substrate held thereon in a horizontal state;
a rotary cup configured to surround the substrate held on the substrate holding member, to rotate along with the substrate, and to receive the process liquid thrown off from the substrate;
a rotation mechanism configured to integrally rotate the rotary cup and the substrate holding member;
a liquid supply mechanism configured to supply a process liquid onto the substrate;
an annular drain cup configured to receive and discharge the process liquid discharged from the rotary cup; and
an annular exhaust cup configured to mainly collect a gas component from inside and around the rotary cup,
wherein the rotary cup has a shape substantially not to cover an area above the substrate held on the substrate holding member,
the drain cup accommodates the rotary cup,
the exhaust cup accommodates the drain cup coaxially therewith,
an upper exhaust inlet port of the exhaust cup is located above the substrate holding member, and
the drain cup has an inner peripheral side and an outer peripheral side both supported by a bottom wall of the exhaust cup such that the inner peripheral side is fixed to the bottom wall by a fixing section and the outer peripheral side is not fixed to the bottom wall.

* * * * *